(12) United States Patent
Chae et al.

(10) Patent No.: US 12,557,483 B2
(45) Date of Patent: Feb. 17, 2026

(54) DISPLAY APPARATUS HAVING A PIXEL DEFINING LAYER WITH OVERHANG STRUCTURE

(71) Applicant: Samsung Display Co., Ltd., Yongin-si (KR)

(72) Inventors: Soojung Chae, Yongin-si (KR); Dahye Park, Yongin-si (KR); Taesun Park, Yongin-si (KR); Seokhwan Bang, Yongin-si (KR); Jemin Lee, Yongin-si (KR)

(73) Assignee: Samsung Display Co., Ltd., Gyeonggi-Do (KR)

( * ) Notice: Subject to any disclaimer, the term of this patent is extended or adjusted under 35 U.S.C. 154(b) by 0 days.

(21) Appl. No.: 18/884,507

(22) Filed: Sep. 13, 2024

(65) Prior Publication Data

US 2025/0176364 A1    May 29, 2025

(51) Int. Cl.
*H10K 59/122* (2023.01)
*H10K 59/00* (2023.01)
*H10K 59/12* (2023.01)
*H10K 59/80* (2023.01)

(52) U.S. Cl.
CPC ....... *H10K 59/122* (2023.02); *H10K 59/1201* (2023.02); *H10K 59/771* (2023.02); *H10K 59/80515* (2023.02); *H10K 59/80517* (2023.02)

(58) Field of Classification Search
CPC ............. H10K 59/122; H10K 59/1201; H10K 59/80515; H10K 59/771; H10K 59/80517
USPC .......................................................... 257/91
See application file for complete search history.

(56) References Cited

U.S. PATENT DOCUMENTS

| | | |
|---|---|---|
| 11,145,700 B2 | 10/2021 | Choi et al. |
| 2014/0103385 A1 | 4/2014 | Hatano et al. |
| 2019/0326372 A1 | 10/2019 | Han et al. |
| 2021/0057504 A1 | 2/2021 | Ko et al. |
| 2023/0157082 A1 | 5/2023 | Choi |
| 2023/0180526 A1* | 6/2023 | Choi .................... H10K 59/124 257/40 |

(Continued)

FOREIGN PATENT DOCUMENTS

| | | |
|---|---|---|
| JP | 2014-82132 | 5/2014 |
| KR | 10-2015-0033345 | 4/2015 |

(Continued)

*Primary Examiner* — Xia L Cross
(74) *Attorney, Agent, or Firm* — Harness, Dickey & Pierce, P.L.C.

(57) ABSTRACT

A display apparatus includes a first pixel electrode, a bank layer including a first opening overlapping the first pixel electrode, and including an overhang portion, a first protective layer between an outer portion of the first pixel electrode and the overhang portion, an intermediate layer overlapping the first pixel electrode, and a counter electrode on the intermediate layer, the overhang portion has a horizontal length from a first edge of a first side surface of the first protective layer to an edge of the overhang portion and has a vertical distance from the top surface of the first pixel electrode to the overhang portion, the intermediate layer includes a charge generation layer, lower sub-layers below the charge generation layer, and upper sub-layers over the charge generation layer, each of the lower sub-layers and the charge generation layer includes portions separated by the overhang portion.

26 Claims, 28 Drawing Sheets

(56) References Cited

U.S. PATENT DOCUMENTS

2023/0180530 A1 6/2023 Sung et al.
2024/0381697 A1* 11/2024 Yang .................... H10K 59/122

FOREIGN PATENT DOCUMENTS

| KR | 10-2019-0122073 | 10/2019 |
| KR | 10-2021-0022206 | 3/2021 |
| KR | 10-2023-0071816 | 5/2023 |
| KR | 10-2023-084399 | 6/2023 |
| KR | 10-2023-085242 | 6/2023 |

* cited by examiner

DISPLAY APPARATUS HAVING A PIXEL DEFINING LAYER WITH OVERHANG STRUCTURE

CROSS-REFERENCE TO RELATED APPLICATION(S)

This application claims priority to and benefits of Korean Patent Application Nos. 10-2023-0170039 and 10-2023-0170040 under 35 U.S.C. § 119, respectively filed on Nov. 29, 2023, and Nov. 29, 2023, in the Korean Intellectual Property Office, the entire contents of which are incorporated by herein by reference.

BACKGROUND

1. Technical Field

One or more embodiments relate to a display apparatus and a method of manufacturing the same.

2. Description of the Related Art

As display apparatuses that visually display electrical signals have been developed, various display apparatuses having excellent characteristics such as thin design, light weight, and low power consumption have been introduced. As the demand for providing high-quality images in display apparatuses has continued, display apparatuses having various structures have been developed.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

One or more embodiments include a structure of a display apparatus and a method of manufacturing the display apparatus.

Additional aspects will be set forth in part in the description which follows and, in part, will be apparent from the description, or may be learned by practice of the presented embodiments.

According to one or more embodiments, a display apparatus may include a first pixel electrode; a bank layer including a first opening overlapping the first pixel electrode, the bank layer including an overhang portion disposed over a top surface of the first pixel electrode; a first protective layer disposed between an outer portion of the first pixel electrode and the overhang portion of the bank layer; an intermediate layer overlapping the first pixel electrode through the first opening of the bank layer, the intermediate layer including a plurality of sub-layers; and a counter electrode disposed on the intermediate layer, wherein the overhang portion has a horizontal length from a first edge of a first side surface of the first protective layer to an edge of the overhang portion and has a vertical distance from the top surface of the first pixel electrode to the overhang portion, the plurality of sub-layers of the intermediate layer include a charge generation layer, lower sub-layers below the charge generation layer, and upper sub-layers over the charge generation layer, and each of the lower sub-layers and the charge generation layer may include a plurality of portions separated by the overhang portion.

The charge generation layer may include an N-type sub-charge generation layer including an N-type dopant material and an N-type host material, and a P-type sub-charge generation layer including a P-type dopant material and a P-type host material.

A sum of a thickness of the charge generation layer and thicknesses of the lower sub-layers may be greater than the vertical distance from the top surface of the first pixel electrode to the overhang portion.

At least one of the upper sub-layers may continuously extend without being separated around the overhang portion.

The counter electrode may continuously extend without being separated around the overhang portion.

The horizontal length of the overhang portion may be greater than the vertical distance.

Each of the lower sub-layers and the upper sub-layers may include a functional layer including an emission layer, a lower common layer below the functional layer, and an upper common layer over the functional layer.

The display apparatus may further include a second pixel electrode adjacent to the first pixel electrode, wherein the intermediate layer may further include another functional layer overlapping the second pixel electrode and including an emission layer, and the functional layer and the other functional layer are spaced apart from each other.

The first protective layer may include a second side surface opposite to the first side surface, wherein a second edge where the second side surface of the first protective layer meets the top surface of the first pixel electrode is spaced apart from a third edge where a side surface of the first pixel electrode meets the top surface of the first pixel electrode.

The first protective layer may extend past a side surface of the first pixel electrode to a top surface of an insulating layer disposed below the first pixel electrode.

The first protective layer may directly contact the side surface of the first pixel electrode.

The first pixel electrode may include a first layer, a second layer disposed on the first layer, and a third layer disposed on the second layer, wherein an inclination angle of a side surface of the second layer is greater than at least one selected from among an inclination angle of a side surface of the first layer and an inclination angle of a side surface of the third layer.

The first protective layer may include a metal oxide.

According to one or more embodiments, a display apparatus may include a first pixel electrode; a bank layer including a first opening overlapping the first pixel electrode, the bank layer including an overhang portion disposed over a top surface of the first pixel electrode; a first protective layer disposed between an outer portion of the first pixel electrode and the overhang portion of the bank layer; an intermediate layer overlapping the first pixel electrode through the first opening of the bank layer; and a counter electrode disposed on the intermediate layer, wherein the intermediate layer may include a plurality of sub-layers, at least one of the plurality of sub-layers may include a plurality of portions separated around the overhang portion, the overhang portion has a horizontal length from a first edge of a first side surface of the first protective layer to an edge of the overhang portion and has a vertical distance from the top surface of the first pixel electrode to the overhang portion, the first protective layer may include a second side surface opposite to the first side surface, and a first inclination angle of the second side surface of the first protective layer is different from a second inclination angle of a side surface of the first pixel electrode.

The first inclination angle may be greater than the second inclination angle.

The horizontal length of the overhang portion may be greater than the vertical distance.

The second side surface of the first protective layer may meet the side surface of the first pixel electrode at a second edge opposite to the first edge, and a minor angle between the second side surface of the first protective layer and the side surface of the first pixel electrode may be greater than about 90° and less than about 180°.

The first pixel electrode may include a first layer, a second layer disposed on the first layer, and a third layer disposed on the second layer, wherein an inclination angle of a side surface of the second layer is different from at least one selected from among an inclination angle of a side surface of the first layer and an inclination angle of a side surface of the third layer.

The inclination angle of the side surface of the second layer may be greater than at least one selected from among the inclination angle of the side surface of the first layer and the inclination angle of a side surface of the third layer.

The plurality of sub-layers of the intermediate layer may include a charge generation layer, lower sub-layers below the charge generation layer, and upper sub-layers over the charge generation layer, wherein each of the lower sub-layers and the charge generation layer may include a plurality of portions separated by the overhang portion.

The charge generation layer may include an N-type sub-charge generation layer including an N-type dopant material and an N-type host material, and a P-type sub-charge generation layer including a P-type dopant material and a P-type host material.

A sum of a thickness of the charge generation layer and thicknesses of the lower sub-layers may be greater than the vertical distance from the top surface of the first pixel electrode to the overhang portion.

At least one of the upper sub-layers may continuously extend without being separated around the overhang portion.

Each of the lower sub-layers and the upper sub-layers may include a functional layer including an emission layer, a lower common layer below the functional layer, and an upper common layer over the functional layer.

The upper common layer and the lower common layer may directly contact each other on the bank layer.

The first protective layer may include a metal oxide.

According to one or more embodiments, a method of manufacturing a display apparatus may include forming a first stacked structure including a first pixel electrode and a first protective layer on the first pixel electrode and a second stacked structure including a second pixel electrode and a second protective layer on the second pixel electrode; forming a bank layer covering a side surface of the first stacked structure and a side surface of the second stacked structure, the bank layer including a first opening overlapping the first pixel electrode and a second opening overlapping the second pixel electrode; removing a part of the first protective layer and a part of the second protective layer through the first opening and the second opening of the bank layer; forming an intermediate layer including a charge generation layer; and forming a counter electrode on the intermediate layer, wherein, in the removing of the part of the first protective layer and the part of the second protective layer, the bank layer may include an overhang portion over a top surface of each of the first pixel electrode and the second pixel electrode, the overhang portion on the first pixel electrode has a horizontal length from a first edge of a first side surface of the first protective layer to an edge of the overhang portion and has a vertical distance from the top surface of the first pixel electrode to the overhang portion, wherein, in the forming of the intermediate layer, the charge generation layer may include a plurality of portions separated by the overhang portion.

The intermediate layer may include lower sub-layers below the charge generation layer, and upper sub-layers over the charge generation layer, wherein, in the forming of the intermediate layer, the lower sub-layers include a plurality of portions separated by the overhang portion.

At least one of the upper sub-layers may continuously extend without being separated around the overhang portion.

Each of the lower sub-layers and the upper sub-layers may include a functional layer including an emission layer, a lower common layer below the functional layer, and an upper common layer over the functional layer.

The upper common layer and the lower common layer may directly contact each other on the bank layer.

The counter electrode may continuously extend without being separated around the overhang portion.

The horizontal length of the overhang portion may be greater than the vertical distance.

Each of the first protective layer and the second protective layer may include a metal oxide.

The forming of the first stacked structure and the second stacked structure may include forming the first pixel electrode and the second pixel electrode spaced apart from each other, forming a preliminary protective layer on the first pixel electrode and the second pixel electrode, forming photoresists disposed on the preliminary protective layer and respectively overlapping the first pixel electrode and the second pixel electrode, and forming the first protective layer and the second protective layer by removing the preliminary protective layer not overlapping the photoresists.

A width of each of the photoresists may be greater than a width of an overlapping pixel electrode from among the first pixel electrode and the second pixel electrode, wherein a second side surface opposite to the first side surface of the first protective layer meets the top surface of the first pixel electrode.

A width of each of the photoresists may be greater than a width of an overlapping pixel electrode from among the first pixel electrode and the second pixel electrode, wherein the first protective layer overlaps a side surface of the first pixel electrode.

The first protective layer may directly contact with a top surface of an insulating layer under the first pixel electrode.

The charge generation layer may include an N-type sub-charge generation layer including an N-type dopant material and an N-type host material, and a P-type sub-charge generation layer including a P-type dopant material and a P-type host material.

A sum of a thickness of the charge generation layer and thicknesses of the lower sub-layers may be greater than the vertical distance from the top surface of the first pixel electrode to the overhang portion.

The first protective layer may include a second side surface opposite to the first side surface, wherein a first inclination angle of the second side surface of the first protective layer may be different from a second inclination angle of a side surface of the first pixel electrode.

The first inclination angle may be greater than the second inclination angle.

The second side surface of the first protective layer may meet the side surface of the first pixel electrode at a second edge opposite to the first edge, and a minor angle between the second side surface of the first protective layer and the side surface of the first pixel electrode around the second edge may be greater than about 90° and less than about 180°.

The first pixel electrode may include a first layer, a second layer disposed on the first layer, and a third layer disposed on the second layer, wherein at least one selected from among an inclination angle of a side surface of the first layer or an inclination angle of a side surface of the third layer is different from an inclination angle of a side surface of the second layer.

The inclination angle of the side surface of the second layer may be greater than at least one selected from among the inclination angle of the side surface of the first layer and the inclination angle of a side surface of the third layer.

BRIEF DESCRIPTION OF THE DRAWINGS

The above and other aspects, features, and advantages of embodiments will be more apparent from the following description taken in conjunction with the accompanying drawings, in which.

DETAILED DESCRIPTION OF THE EMBODIMENTS

Figure 1:
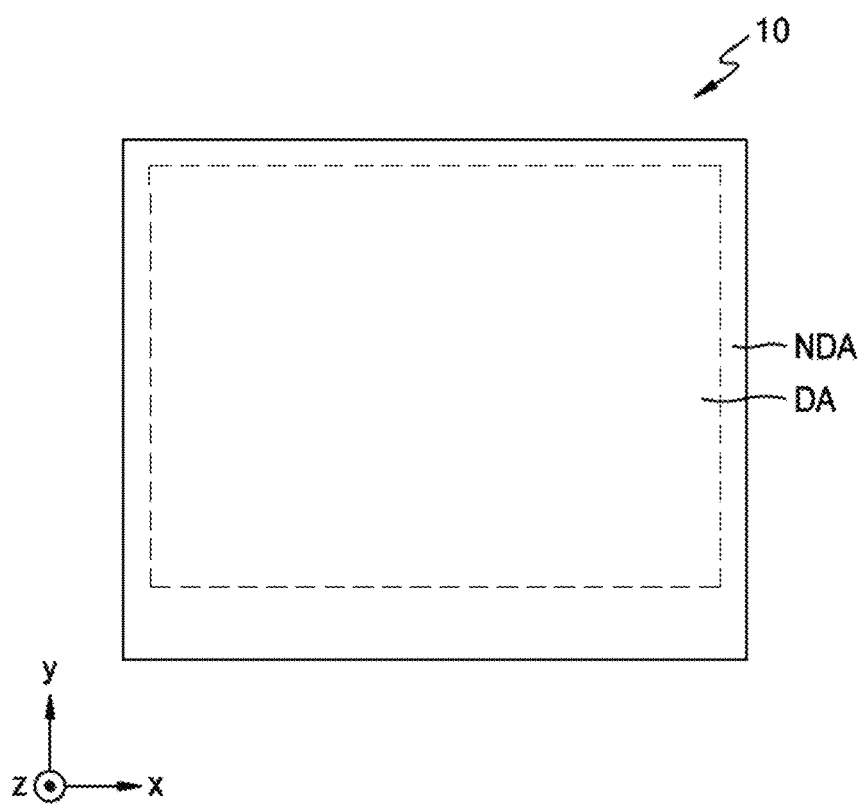
FIG. 1 is a schematic plan view schematically illustrating a display apparatus, according to an embodiment.

Reference will now be made in detail to embodiments, examples of which are illustrated in the accompanying drawings, wherein like reference numerals refer to like elements throughout. In this regard, the embodiments may have different forms and should not be construed as being limited to the descriptions set forth herein. Accordingly, the embodiments are described below, by referring to the figures, to explain aspects of the description.

As used herein, the term "and/or" includes any and all combinations of one or more of the associated listed items.

Throughout the disclosure, the expression "at least one of a, b or c" indicates only a, only b, only c, both a and b, both a and c, both b and c, all of a, b, and c, or variations thereof.

As the disclosure allows for various changes and numerous embodiments, embodiments will be illustrated in the drawings and described in the detailed description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described in detail with reference to the accompanying drawings, wherein the same or corresponding elements are denoted by the same reference numerals throughout and a repeated description thereof may be omitted.

Although the terms "first," "second," etc. may be used to describe various elements, these elements should not be limited by these terms. These terms are only used to distinguish one element from another.

As used herein, the singular forms "a," "an," and "the" are intended to include the plural forms as well, unless the context clearly indicates otherwise.

It will be understood that the terms "comprising", "including," and "having," are intended to indicate the existence of the features or elements described in the specification, and are not intended to preclude the possibility that one or more other features or elements may exist or may be added.

It will be further understood that, when a layer, region, or component is referred to as being "on" another layer, region, or component, it may be directly on the other layer, region, or component, or may be indirectly on the other layer, region, or component with intervening layers, regions, or components therebetween.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

When an element is described as 'not overlapping' or 'to not overlap' another element, this may include that the elements are spaced apart from each other, offset from each other, or set aside from each other or any other suitable term as would be appreciated and understood by those of ordinary skill in the art.

Sizes of components in the drawings may be exaggerated or reduced for convenience of explanation. For example, because sizes and thicknesses of components in the drawings are arbitrarily illustrated for convenience of explanation, the disclosure is not limited thereto.

When an embodiment may be implemented differently, a specific process order may be different from the described order. For example, two consecutively described processes may be performed substantially at the same time or may be performed in an order opposite to the described order.

It will be understood that when a layer, a region, or a component is referred to as being "connected" to another layer, region, or component, it may be "directly connected"

to the other layer, region, or component and/or may be "indirectly connected" to the other layer, region, or component with other layers, regions, or components disposed therebetween. For example, when a layer, a region, or a component is referred to as being "electrically connected," it may be directly electrically connected, and/or may be indirectly electrically connected with intervening layers, regions, or components therebetween.

The x-axis, the y-axis and the z-axis are not limited to three axes of the rectangular coordinate system and may be interpreted in a broader sense. For example, the x-axis, the y-axis, and the z-axis may be perpendicular to one another or may represent different directions that are not perpendicular to one another.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic plan view illustrating a display apparatus 10, according to an embodiment.

Referring to FIG. 1, the display apparatus 10 may include a display area DA where an image is displayed and a non-display area NDA outside the display area DA. The display area DA may be entirely surrounded by the non-display area NDA.

In a plan view, the display area DA may have a rectangular shape. In an embodiment, the display area DA may have a polygonal shape (for example, a triangular shape, a pentagonal shape, or a hexagonal shape), a circular shape, an elliptical shape, or an irregular shape. The display area DA may have a shape with round corners.

The display apparatus 10 is a device for displaying a moving image or a still image and may be used in a portable electronic device such as a laptop, a tablet personal computer (PC), a mobile phone, a smartphone, a mobile communication terminal, an electronic organizer, an electronic book, a portable multimedia player (PMP), a navigation device, or an ultra-mobile PC (UMPC). Also, the display apparatus 10 may be used in an electronic device such as a television, a laptop computer, a monitor, an advertisement board, or an Internet of things (IoT) device or may be used in a wearable electronic device such as a smart watch, a watch phone, a glasses-type display, or a head-mounted display (HMD). Also, the display apparatus 10 according to an embodiment may be used in an electronic device for display such as a center information display (CID) located (or disposed) on an instrument panel, a center fascia, or a dashboard of a vehicle, a room mirror display replacing a side-view mirror of a vehicle, or a display screen located on the back of a front seat for entertainment for a back seat of a vehicle.

Figure 2:
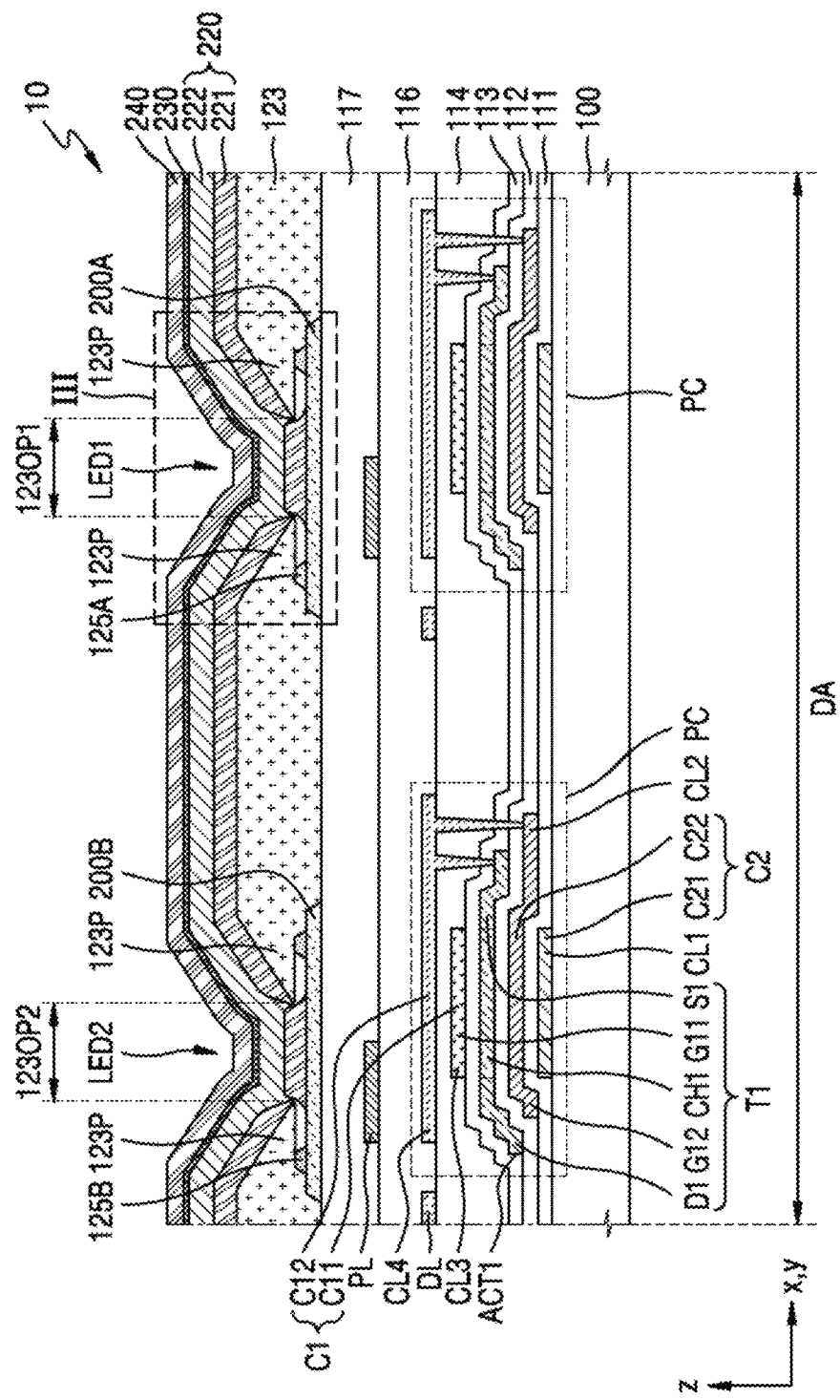
FIG. 2 is a schematic cross-sectional view illustrating a part of a display apparatus, according to an embodiment.

FIG. 2 is a schematic cross-sectional view illustrating a part of the display apparatus 10, according to an embodiment.

Referring to FIG. 2, the display apparatus 10 may include a substrate 100, pixel circuits PC located on the substrate 100, and light-emitting diodes respectively electrically connected to the pixel circuits PC. In this regard, FIG. 2 illustrates first and second light-emitting diodes LED1 and LED2.

The substrate 100 may include a glass material or a polymer resin. In an embodiment, the substrate 100 may have a structure in which a base layer including a polymer resin and a barrier layer including an inorganic insulating material such as silicon oxide or silicon nitride are alternately stacked each other. Examples of the polymer resin may include polyethersulfone, polyarylate, polyether imide, polyethylene naphthalate, polyethylene terephthalate, polyphenylene sulfide, polyimide, polycarbonate, cellulose triacetate, and cellulose acetate propionate.

The pixel circuit PC may include a transistor and a capacitor, and in this regard, FIG. 2 illustrates a first transistor T1, a first capacitor C1, and a second capacitor C2. The pixel circuit PC may include conductive layers and a semiconductor layer constituting the transistor or the capacitor.

A first conductive layer CL1 may be located on the substrate 100. The first conductive layer CL1 may include a conductive material such as a metal. For example, the first conductive layer CL1 may include a conductive material including molybdenum (Mo), aluminum (Al), copper (Cu), or titanium (Ti) and may have a single or multi-layer structure including the above material.

A buffer layer 111 may be located on the first conductive layer CL1. The buffer layer 111 may include an inorganic insulating material such as silicon oxide, silicon nitride, or silicon oxynitride and may have a single or multi-layer structure including the inorganic insulating material.

A second conductive layer CL2 may be located on the buffer layer 111 and may overlap the first conductive layer CL1. In an embodiment, the first conductive layer CL1 may include a first electrode C21 of the second capacitor C2, and the second conductive layer CL2 may include a second electrode C22 of the second capacitor C2. The second conductive layer CL2 may include a conductive material including molybdenum (Mo), aluminum (Al), copper (Cu), or titanium (Ti) and may have a single or multi-layer structure including the above material.

A first insulating layer 112 may be located on the second conductive layer CL2. The first insulating layer 112 may include an inorganic insulating material such as silicon oxide, silicon nitride, or silicon oxynitride and may have a single or multi-layer structure including the inorganic insulating material.

A semiconductor layer ACT1 may be located on the first insulating layer 112. The semiconductor layer ACT1 may include a channel region CH1, and a source region S1 and a drain region D1 located on both sides of the channel region CH1. The semiconductor layer ACT1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layer ACT1 may be an InSnZnO (ITZO) semiconductor layer or an InGaZnO (IGZO) semiconductor layer. A conductive process by plasma treatment or the like may be performed on at least a part of the semiconductor layer ACT1.

A third conductive layer CL3 may be located on the semiconductor layer ACT1 with a second insulating layer 113 therebetween. A part of the third conductive layer CL3 may include a 1-1 gate electrode G11 overlapping the channel region CH1, and a part of the second conductive layer CL2 may include a 1-2 gate electrode G12 overlapping the channel region CH1. The 1-1 gate electrode G11 and the 1-2 gate electrode G12 may overlap each other with the channel region CH1 therebetween. The second insulating layer 113 may include an inorganic insulating material such as silicon oxide, silicon nitride, or silicon oxynitride and may have a single or multi-layer structure including the inorganic insulating material.

A third insulating layer 114 may be located on the third conductive layer CL3. The third insulating layer 114 may include an inorganic material such as silicon oxide, silicon nitride, or silicon oxynitride and may have a single or multi-layer structure including the inorganic insulating material.

The third conductive layer CL3 may include a first electrode C11 of the first capacitor C1, and a fourth conductive layer CL4 on the third insulating layer 114 may include a second electrode C12 of the first capacitor C1. Each of the third conductive layer CL3 and the fourth conductive layer CL4 may include a conductive material molybdenum (Mo), aluminum (Al), copper (Cu), or titanium (Ti) and may have a single or multi-layer structure including the above material.

A data line DL may be located on the third insulating layer 114. The data line DL may include a conductive material including molybdenum (Mo), aluminum (Al), copper (Cu), or titanium (Ti) and may have a single or multi-layer structure including the above material.

A fourth insulating layer 116 may be located on the data line DL. The fourth insulating layer 116 may include an organic insulating material such as acryl, benzocyclobutene (BCB), polyimide, or hexamethyldisiloxane (HMDSO).

A driving voltage line PL may be located on the fourth insulating layer 116 and may be covered by a fifth insulating layer 117. The driving voltage line PL may include a conductive material including molybdenum (Mo), aluminum (Al), copper (Cu), or titanium (Ti) and may have a single or multi-layer structure including the above material. The fifth insulating layer 117 may include an organic insulating material.

A light-emitting diode may include a pixel electrode, a counter electrode, and an intermediate layer located between the pixel electrode and the counter electrode. For example, the first light-emitting diode LED1 may have a stacked structure of a first pixel electrode 200A, an intermediate layer 220, and a counter electrode 230, and the second light-emitting diode LED2 may have a stacked structure of a second pixel electrode 200B, the intermediate layer 220, and the counter electrode 230.

The first pixel electrode 200A and the second pixel electrode 200B may be located on the fifth insulating layer 117 to be spaced apart from each other. Each of the first pixel electrode 200A and the second pixel electrode 200B may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, each of the first pixel electrode 200A and the second pixel electrode 200B may further include a conductive oxide layer over and/or under the reflective film.

A bank layer 123 may be located on the first pixel electrode 200A and the second pixel electrode 200B. The bank layer 123 may include a first opening 123OP1 and a second opening 123OP2 respectively overlapping the first pixel electrode 200A and the second pixel electrode 200B. The bank layer 123 may include an organic insulating material. For example, the bank layer 123 may include an organic insulating material including a light-blocking material. In an embodiment, the bank layer 123 may include a polyimide (PI)-based binder, and a pigment in which red, green, and blue colors are mixed. By way of example, the bank layer 123 may include a cardo-based binder resin, and a mixture of a lactam black pigment and a blue pigment. By way of example, the bank layer 123 may include carbon black. The bank layer 123 may improve the contrast of the display apparatus 10.

The bank layer 123 may include an overhang portion 123P located on (for example over) a top surface of each of the first pixel electrode 200A and the second pixel electrode 200B. Each overhang portion 123P may overlap an outer portion of each of the first pixel electrode 200A and the second pixel electrode 200B. In other words, an inner portion of the first pixel electrode 200A may overlap the first opening 123OP1 and the outer portion of the first pixel electrode 200A may overlap the overhang portion 123P. The overhang portion 123P overlapping the first pixel electrode 200A may be spaced apart from the top surface of the first pixel electrode 200A along a direction (for example, a z direction) perpendicular to the top surface of the first pixel electrode 200A. An inner portion of the second pixel electrode 200B may overlap the second opening 123OP2, and the outer portion of the second pixel electrode 200B may overlap the overhang portion 123P. The overhang portion 123P overlapping the second pixel electrode 200B may be spaced apart from the top surface of the second pixel electrode 200B along a direction (for example, the z direction) perpendicular to the topo surface of the second pixel electrode 200B.

A first protective layer 125A and a second protective layer 125B may be respectively located on the first pixel electrode 200A and the second pixel electrode 200B. The first protective layer 125A and the second protective layer 125B may be respectively located on the outer portions of the first pixel electrode 200A and the second pixel electrode 200B and may have a closed loop shape (or a frame shape) in a plan view.

The first protective layer 125A may be disposed between the first pixel electrode 200A and the overhang portion 123P overlapping the first pixel electrode 200A, and the second protective layer 125B may be disposed between the second pixel electrode 200B and the overhang portion 123P overlapping the second pixel electrode 200B.

Each of the first protective layer 125A and the second protective layer 125B may include a metal oxide. Each of the first protective layer 125A and the second protective layer 125B may include zinc oxide (ZnO). By way of example, each of the first protective layer 125A and the second protective layer 125B may include zinc oxide and at least one selected from among indium oxide (InO), gallium oxide (GaO), and tin oxide (SnO). The content (at %) of at least one selected from among indium oxide (InO), gallium oxide (GaO), and tin oxide (SnO) included in each of the first protective layer 125A and the second protective layer 125B may be less than the content (at %) of zinc oxide.

The overhang portion 123P of the bank layer 123 located on the first pixel electrode 200A may extend past the first protective layer 125A in a horizontal direction (for example, x or y direction) toward the inner portion of the first pixel electrode 200A. A void (or a gap or a space) may be formed under the overhang portion 123P. Likewise, the overhang portion 123P of the bank layer 123 located on the second pixel electrode 200B may extend past the second protective layer 125B in the horizontal direction (for example, the x or y direction) toward the inner portion of the second pixel electrode 200B, and a void (or a gap or a space) may be formed under the overhang portion 123P.

The intermediate layer 220 may include sub-layers. At least one of the sub-layers may be separated around the overhang portion 123P. In an embodiment, sub-layers 221 located at relatively low positions from among the sub-layers included in the intermediate layer 220 are separated around the overhang portion 123P, and sub-layers 222 located at relatively high positions continuously extend without being separated around the overhang portion 123P. The sub-layers 221 located at lower positions may include a first portion and a second portion separated around the overhang portion 123P, and any one of the first portion and the second portion may be located on the top surface of the first or second pixel electrode 200A or 200B and the other may be located on the overhang portion 123P.

The counter electrode 230 may be located on the intermediate layer 220. The counter electrode 230 may be continuously formed without being separated around the overhang portion 123P. In other words, the counter electrode 230 may be shared by light-emitting diodes, for example, the first and second light-emitting diodes LED1 and LED2. The counter electrode 230 may overlap pixel electrodes, for example, the first and second pixel electrodes 200A and 200B.

The counter electrode 230 may be formed of a conductive material having a low work function. The counter electrode 230 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. By way of example, the counter electrode 230 may further include a layer formed of ITO, IZO, ZnO, or $In_2O_3$ on the (semi-)transparent layer including the above material.

An upper layer 240 may be continuously formed, like the counter electrode 230. The upper layer 240 may overlap light-emitting diodes, for example, the first and second light-emitting diodes LED1 and LED2. The upper layer 240 may include a LiF layer and/or a capping layer, and the capping layer may be an organic capping layer including an organic material, an inorganic capping layer including an inorganic material, or an organic-inorganic composite capping layer including an organic material and an inorganic material. The capping layer may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

Although not shown in FIG. 2, the light-emitting diodes, for example, the first and second light-emitting diodes LED1 and LED2, may be protected by an encapsulation layer. The encapsulation layer may include at least one inorganic encapsulation layer including an inorganic insulating material and at least one organic encapsulation layer including an organic insulating material. In an embodiment, the encapsulation layer may include a first inorganic encapsulation layer, a second inorganic encapsulation layer, and an organic encapsulation layer between the first inorganic encapsulation layer and the second inorganic encapsulation layer.

Figure 3:
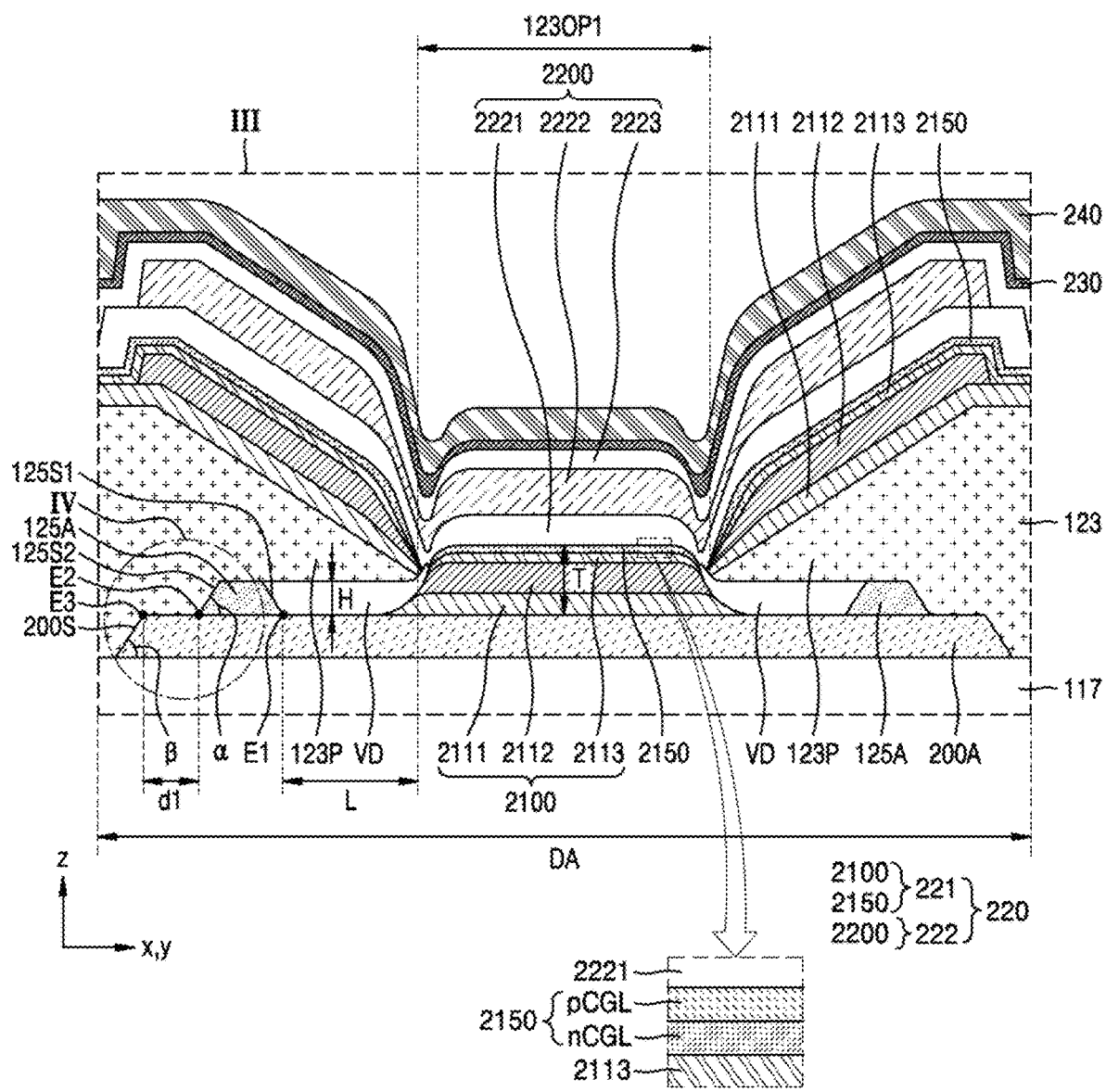
FIG. 3 is an enlarged schematic cross-sectional view illustrating a portion III of FIG. 2.

FIG. 3 is an enlarged schematic cross-sectional view illustrating a portion III of FIG. 2. Although FIG. 3 illustrates the first pixel electrode 200A and a structure on the first pixel electrode 200A, the description made with reference to FIG. 3 may apply to another pixel electrode and a structure on the pixel electrode, for example, the second pixel electrode 200B and a structure on the second pixel electrode 200B.

Referring to FIG. 3, the first pixel electrode 200A may be located on an insulating layer, for example, the fifth insulating layer 117, and the first protective layer 125A may be located on an outer portion of the first pixel electrode 200A.

The overhang portion 123P of the bank layer 123 may overlap an end, for example, the outer portion, of the first pixel electrode 200A. The first protective layer 125A may be located between the overhang portion 123P and the first pixel electrode 200A, the overhang portion 123P may extend past the first protective layer 125A in the horizontal direction (for example, the x or y direction), and a void VD (for example, a gap or a space) may be formed between the first pixel electrode 200A and the overhang portion 123P.

A horizontal length L of the overhang portion 123P may be greater than a vertical distance H of the overhang portion 123P. The horizontal length L of the overhang portion 123P refers to a length from a point (hereinafter, referred to as a first edge E1) where a first side surface 125S1, which is an inner surface of the first protective layer 125A, and a bottom surface of the first protective layer 125A meet each other to an edge of the overhang portion 123P in the horizontal direction (for example, the x or y direction). The vertical distance H of the overhang portion 123P refers to a length from a top surface of the first pixel electrode 200A to a bottom surface of the overhang portion 123P in the vertical direction (for example, the z direction).

In an embodiment, the horizontal length L of the overhang portion 123P may be in a range of about 100 nm to about 900 nm, and the vertical distance H from the top surface of the first pixel electrode 200A to the overhang portion 123P may be in a range of about 10 nm to about 900 nm. In an embodiment, the vertical distance H of the overhang portion 123P may be in a range of about 10 nm to about 90 nm. In an embodiment, the horizontal length L of the overhang portion 123P may be about 2 to 10 times the vertical distance H ($2H \leq L \leq 10H$). In an embodiment, the horizontal length L of the overhang portion 123P may be about 500 nm, and the vertical distance H may be about 50 nm.

The first protective layer 125A may include the first side surface 125S1 facing the inside and a second side surface 125S2 opposite to the first side surface 125S1. The second side surface 125S2 of the first protective layer 125A may be spaced apart from a side surface 200S of the first pixel electrode 200A by a first distance d1 along the horizontal direction (for example, the x or y direction).

The second side surface 125S2 of the first protective layer 125A may contact the top surface of the first pixel electrode 200A. A point (for example, a second edge E2) where the second side surface 125S2 of the first protective layer 125A and the bottom surface of the first protective layer 125A (or the top surface of the first pixel electrode 200A) meet each other may be spaced apart by the first distance d1 from a point (hereinafter, referred to as a third edge E3) where the top surface of the first pixel electrode 200A and the side surface 200S meet each other.

A first inclination angle α of the second side surface 125S2 of the first protective layer 125A may be the same as or different from a second inclination angle β of the side surface 200S of the first pixel electrode 200A. In an embodiment, the first inclination angle α of the second side surface 125S2 of the first protective layer 125A with respect to the bottom surface of the first protective layer 125A (or the top surface of the first pixel electrode 200A) may be about 45° to about 60°. The second inclination angle β of the side surface of the first pixel electrode 200A with respect to a bottom surface of the first pixel electrode 200A (or a top surface of the fifth insulating layer 117) may be about 45° to about 60°.

The intermediate layer 220 may have a tandem structure including a charge generation layer 2150, lower sub-layers 2100 under the charge generation layer 2150, and upper sub-layers 2200 over the charge generation layer 2150.

The lower sub-layers 2100 may include a first lower common layer 2111, a lower functional layer 2112, and a second lower common layer 2113.

The first lower common layer 2111 may include, for example, a hole transport layer (HTL), or may include a hole transport layer and a hole injection layer (HIL). The second low common layer 2113 may include an electron transport layer (ETL) and/or an electron injection layer (EIL).

The lower functional layer 2112 may include an emission layer or may have a multi-layer structure including an emission layer and an auxiliary layer. The emission layer may include a high molecular weight organic material or a low molecular weight organic material that emits light of a given color (for example, red light, green light, or blue light). The auxiliary layer may increase device efficiency by compensating for an optical resonance distance of light emitted from the emission layer. The auxiliary layer may include a resonance auxiliary material, for example, the same material as a hole transport layer. In an embodiment, a thickness of the lower functional layer 2112 may be greater than a thickness of the first lower common layer 2111 and/or a thickness of the second lower common layer 2113. A thickness of the first lower common layer 2111 may be greater than a thickness of the second lower common layer 2113.

The lower functional layer 2112 may be formed by using a mask having openings respectively corresponding to light-emitting diodes, and thus, the lower functional layer 2112 of each light-emitting diode may be separated and spaced apart from a lower functional layer of another adjacent light-emitting diode.

In an embodiment, the first lower common layer 2111 and/or the second lower common layer 2113 may be formed by using a mask having an opening that is substantially the same as the entire area of the display area DA. In this case, the second lower common layer 2113 may directly contact and the first lower common layer 2111 around an end of the lower functional layer 2112. A contact area between the second lower common layer 2113 and the first lower common layer 2111 may be located on a top surface of the bank layer 123. In an embodiment, at least one layer or a layer included in the second lower common layer 2113 may be formed by using a mask having openings respectively corresponding to the light-emitting elements, like the lower functional layer 2112.

The upper sub-layers 2200 may include a first upper common layer 2221, an upper functional layer 2222, and a second upper common layer 2223.

The first upper common layer 2221 may include, for example, a hole transport layer (HTL), or may include a hole transport layer and a hole injection layer (HIL). The second upper common layer 2223 may include an electron transport layer (ETL) and/or an electron injection layer (EIL).

The upper functional layer 2222 may include an emission layer or may have a multi-layer structure including an emission layer and an auxiliary layer. The emission layer may include a high molecular weight organic material or a low molecular weight organic material that emits light of a given color (for example, red light, green light, or blue light). The auxiliary layer may increase device efficiency by compensating for an optical resonance distance of light emitted from the emission layer. The auxiliary layer may include a resonance auxiliary material, for example, the same material as a hole transport layer. The emission layer of the upper functional layer 2222 may emit light of the same color as the emission layer of the lower functional layer 2112 and may include the same material as the emission layer of the lower functional layer 2112. In an embodiment, a thickness of the upper functional layer 2222 may be greater than a thickness of the first upper common layer 2221 and/or a thickness of the second upper common layer 2223. In an embodiment, a thickness of the upper functional layer 2222 may be less than a thickness of the first upper common layer 2221 and may be greater than a thickness of the second upper common layer 2223. A thickness of the second upper common layer 2223 may be less than a thickness of the first upper common layer 2221. In an embodiment, a thickness of the first upper common layer 2221 may be greater than a thickness of the first lower common layer 2111. A thickness of the second upper common layer 2223 may be greater than a thickness of the second lower common layer 2113.

The upper functional layer 2222 may be individually formed according to a corresponding light-emitting diode. In other words, the upper functional layer 2222 of each light-emitting diode may be separated and spaced apart from an upper functional layer of another adjacent light-emitting diode.

In an embodiment, the first upper common layer 2221 and the second upper common layer 2223 may be formed by using a mask having an opening that is substantially the same as the entire area of the display area DA. In this case, the second upper common layer 2223 may directly contact the first upper common layer 2221 around an end of the upper functional layer 2222. A contact area between the second upper common layer 2223 and the first upper common layer 2221 may be located on the top surface of the bank layer 123. In an embodiment, at least one layer or a layer included in the first upper common layer 2221 may be individually formed according to a light-emitting diode.

The charge generation layer 2150 may be located between the second lower common layer 2113 and the first upper common layer 2221. The charge generation layer 2150 may include a host and a dopant.

In an embodiment, the charge generation layer 2150 may have a double-layer structure including an N-type sub-charge generation layer nCGL and a P-type sub-charge generation layer pCGL. The N-type sub-charge generation layer and the P-type sub-charge generation layer may increase the luminous efficiency of a tandem type light-emitting diode including emission layers.

The N-type sub-charge generation layer may include an N-type dopant material and an N-type host material. The N-type dopant material may be an organic material or a mixture thereof, which may inject group 1 and 2 metals or electrons in the periodic table. For example, the N-type dopant material may be any one of an alkali metal and an alkaline-earth metal. For example, the N-type sub-charge generation layer may include, but is not limited to, an organic layer doped with an alkali metal such as lithium (Li), sodium (Na), potassium (K), or cesium (Cs), or an alkaline-earth metal such as magnesium (Mg), strontium (Sr), barium (Ba), or radium (Ra). The N-type host material may include a material that may transfer electrons. For example, the n-type host material may include at least one of, but not limited to, tris(8-hydroxyquinolino)aluminum (Alq3), 8-hydroxyquinolinolato-lithium (Liq), 2-(4-biphenylyl)-5-(4-tert-butylphenyl)-1,3,4oxadiazole (PBD), 3-(4-biphenyl)4-phenyl-5-tert-butylphenyl-1,2,4-triazole (TAZ), spiro-PBD, bis(2-methyl-8-quinolinolate)-4-(phenylphenolato)aluminum (BAlq), SAlq, 2,2',2-(1,3,5-benzinetriyl)-tris(1-phenyl-1-H-benzimidazole) (TPBi), oxadiazole, triazole, phenanthroline, benzoxazole, and benzthiazole.

The P-type sub-charge generation layer may include a P-type dopant material and a P-type host material. The P-type dopant material may include, but is not limited thereto, a metal oxide, an organic material such as tetrafluoro-tetracyanoquinodimethane (F4-TCNQ), hexaazatriphenylene-hexacarbonitrile (HAT-CN), or hexaazatriphenylene, or a metal material such as $V_2O_5$, MoOx, or $WO_3$. The P-type host material may include a material that may transfer holes. For example, the p-type host material may include at least one of, but not limited to, N,N-dinaphthyl-N,N'-diphenyl benzidine (N,N'-bis(naphthalene-1-yl)-N,N'-bis(phenyl)-2,2'-dimethylbenzidine) (NPD), N,N'-bis-(3-methylphenyl)-N,N'-bis-(phenyl)-benzidine (TPD), and 4,4',4-Tris(N-3-methylphenyl-N-phenyl-amino)-triphenylamine (MTDATA).

Some sub-layers included in the intermediate layer 220, for example, the charge generation layer 2150 and the lower sub-layers 2100 under the lower sub-layers 2150, may include portions separated around the overhang portion 123P. The charge generation layer 2150 and the lower sub-layers 2100 may correspond to the sub-layers 221 located at relatively low positions from among the sub-layers of the intermediate layer 220 described with reference to FIG. 2.

A first portion of each of the first lower common layer 2111, the lower functional layer 2112, the second lower common layer 2113, and the charge generation layer 2150 may be located on the first pixel electrode 200A through the first opening 123OP1. A second portion of each of the first lower common layer 2111, the lower functional layer 2112, the second lower common layer 2113, and the charge generation layer 2150, which is separated from the first portion, may be located on the bank layer 123, for example, on the overhang portion 123P.

In an embodiment, a sum T of thicknesses of the first lower common layer 2111, the lower functional layer 2112, the second lower common layer 2113, and the charge generation layer 2150 may be greater than the vertical distance H of the overhang portion 123P.

The remaining sub-layers included in the intermediate layer 220, for example, the first upper common layer 2221, the upper functional layer 2222, and the second upper common layer 2223, may be continuously formed without being separated around the overhang portion 123P. The upper sub-layers 2200 of FIG. 3 may correspond to the sub-layers 222 located at relatively high positions from among the sub-layers of the intermediate layer 220 described with reference to FIG. 2.

Although the first upper common layer 2221, the upper functional layer 2222, and the second upper common layer 2223 are continuously formed in FIG. 3, the disclosure is not limited thereto. In an embodiment, at least one selected from among the first upper common layer 2221, the upper functional layer 2222, and the second upper common layer 2223 may be separated around the overhang portion 123P, like the charge generation layer 2150.

Each of the counter electrode 230 and the upper layer 240 may be continuously formed without being separated around the overhang portion 123P.

Figure 4:
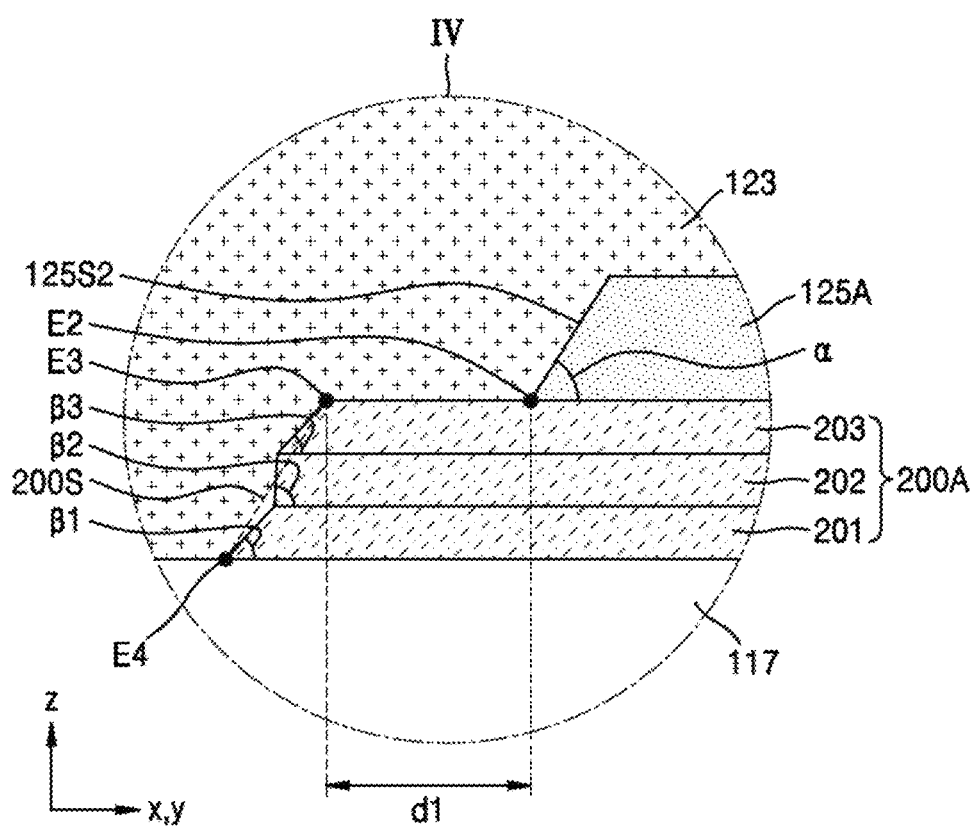
FIG. 4 is an enlarged schematic cross-sectional view illustrating a portion IV of FIG. 3.

FIG. 4 is an enlarged schematic cross-sectional view illustrating a portion IV of FIG. 3.

Referring to FIG. 4, the first pixel electrode 200A may have a multi-layer structure. For example, the first pixel electrode 200A may have a three-layer structure including a first layer 201, a second layer 202, and a third layer 203. A material of the second layer 202 may be different from a material of the first layer 201 and a material of the third layer 203.

In an embodiment, the second layer 202 may include silver (Ag), magnesium (Mg), aluminum (Al), platinum (Pt), palladium (Pd), gold (Au), nickel (Ni), neodymium (Nd), iridium (Ir), chromium (Cr), or a compound thereof. Each of the first layer 201 and the third layer 203 may include a conductive oxide. The conductive oxide may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the second layer 202 of the first pixel electrode 200A may be a layer including silver (Ag), and each of the first layer 201 and the third layer 203 may be a layer including ITO.

An inclination angle $\beta 2$ of a side surface of the second layer 202 may be different from at least one selected from among an inclination angle $\beta 1$ of a side surface of the first layer 201 and an inclination angle $\beta 3$ of a side surface of the third layer 203. For example, the inclination angle $\beta 2$ of the side surface of the second layer 202 with respect to a bottom surface of the second layer 202 may be greater than the inclination angle $\beta 1$ of the side surface of the first layer 201 with respect to a bottom surface of the first layer 201 and/or the inclination angle $\beta 3$ of the side surface of the third layer 203 with respect to a bottom surface of the third layer 203.

The side surface 200S of the first pixel electrode 200A described with reference to FIG. 3 may correspond to a surface that connects an edge (for example, a fourth edge E4) where the bottom surface and the side surface of the first layer 201 of FIG. 4 meet each other to an edge (for example, the third edge E3) where a top surface and the side surface of the third layer 203 meet each other.

The first protective layer 125A may be located on a top surface of the first pixel electrode 200A, and as described with reference to FIGS. 2 and 3, the second edge E2 that is a point where the second side surface 125S2 of the first protective layer 125A and the top surface of the first pixel electrode 200A meet each other may be spaced apart from the third edge E3 by the first distance d1.

A structure of the first pixel electrode 200A described with reference to FIG. 4 may be applied to other pixel electrodes. For example, the second pixel electrode 200B may also have a three-layer structure as described with reference to FIG. 4.

Figure 5A:
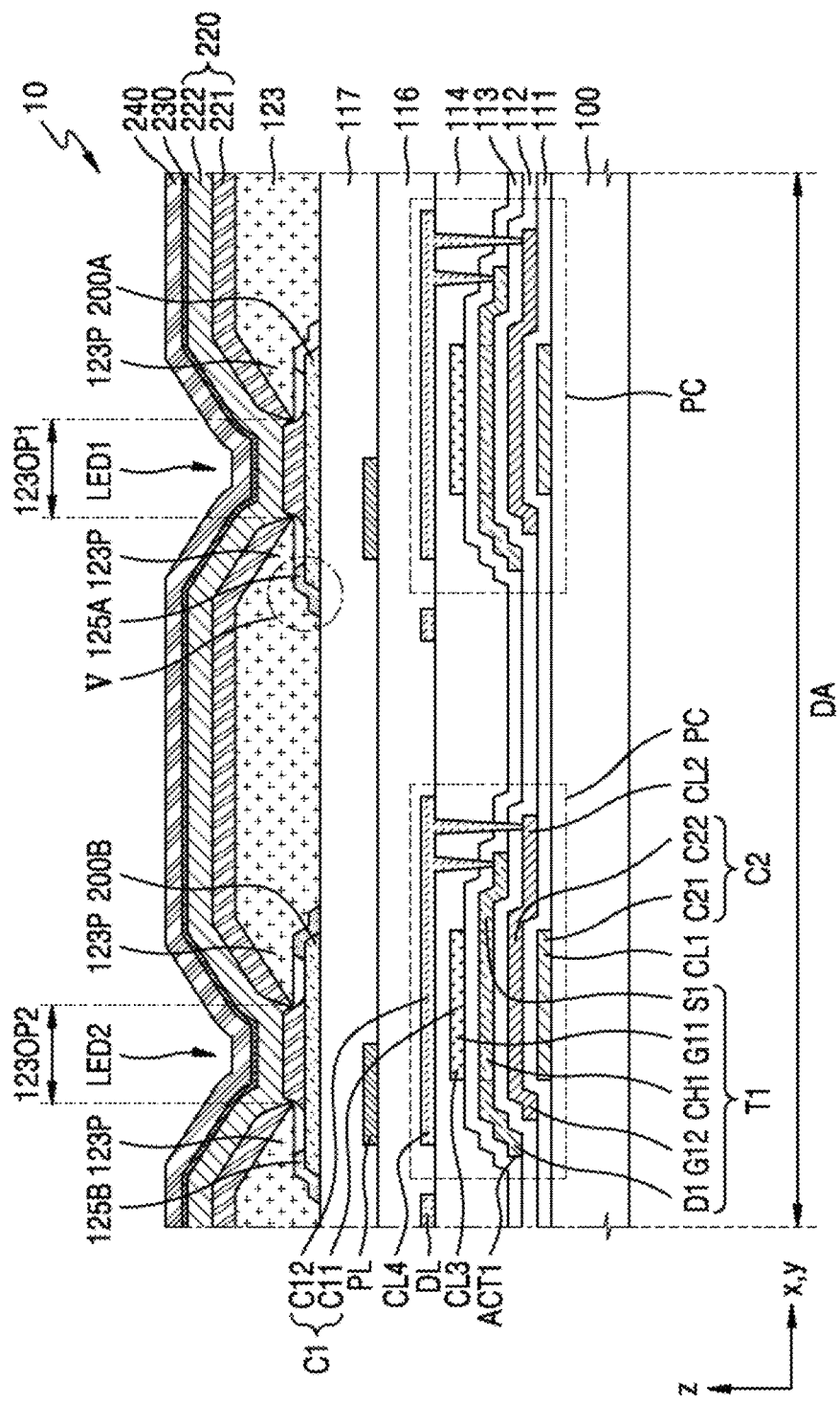
FIG. 5A is a schematic cross-sectional view schematically illustrating a display apparatus, according to an embodiment.
Figure 5B:
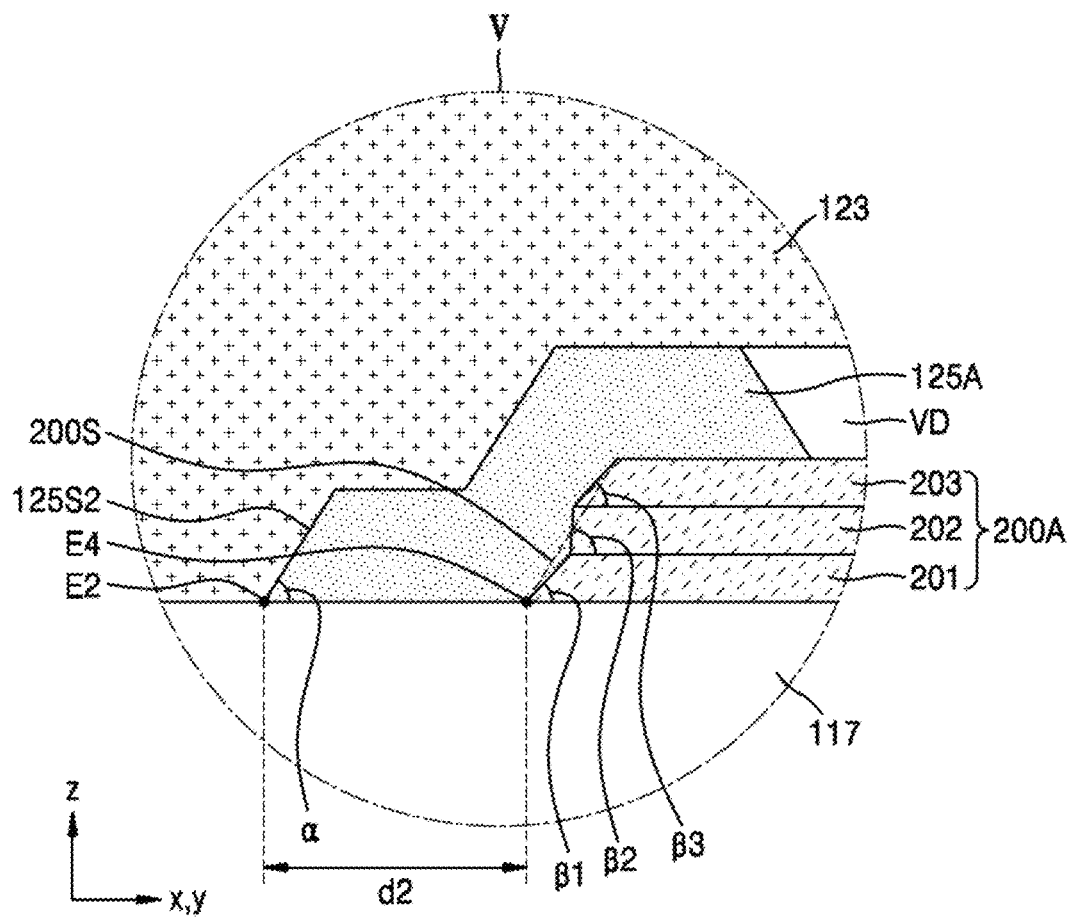
FIG. 5B is an enlarged schematic cross-sectional view illustrating a portion V of FIG. 5A.

FIG. 5A is a schematic cross-sectional view schematically illustrating a display apparatus, according to an embodiment. FIG. 5B is an enlarged schematic cross-sectional view illustrating a portion V of FIG. 5A.

In the display apparatus 10 according to an embodiment of FIG. 5A, the first protective layer 125A and the second protective layer 125B extend to a top surface of the fifth insulating layer 117 while respectively overlapping side surfaces of the first pixel electrode 200A and the second pixel electrode 200B. Structures other than structures of the first protective layer 125A and the second protective layer 125B are the same as those described with reference to FIGS. 2 and 3, and thus, a repeated description may be omitted and a difference will be described.

The first protective layer 125A may be located on an outer portion of the first pixel electrode 200A and may extend past the side surface of the first pixel electrode 200A to the top surface of the fifth insulating layer 117. Accordingly, the first protective layer 125A may directly contact the side surface of the first pixel electrode 200A and the top surface of the fifth insulating layer 117. Likewise, the second protective layer 125B may be located on an outer portion of the second pixel electrode 200B and may extend past the side surface of the second pixel electrode 200B to the top surface of the fifth insulating layer 117. Accordingly, the second protective layer 125B may directly contact the side surface of the second pixel electrode 200B and the top surface of the fifth insulating layer 117. The first protective layer 125A and the second protective layer 125B may be spaced apart from each other.

Referring to FIG. 5B, the first protective layer 125A may continuously overlap a part of a top surface corresponding to the outer portion of the first pixel electrode 200A, the side surface 200S of the first pixel electrode 200A, and the top surface of the fifth insulating layer 117. The first protective layer 125A may directly contact the part of the top surface corresponding to the outer portion of the first pixel electrode 200A, the side surface 200S of the first pixel electrode 200A, and the top surface of the fifth insulating layer 117.

The second side surface 125S2 that is an outer surface of the first protective layer 125A may be spaced apart from the side surface 200S of the first pixel electrode 200A. A point (or the second edge E2) where the second side surface 125S2 of the first protective layer 125A and a bottom surface of the first protective layer 125A (or the top surface of the fifth insulating layer 117) meet each other may be spaced apart from the side surface 200S of the first pixel electrode 200A by a second distance d2. For example, a point (or the second edge E2) where the second side surface 125S2 of the first protective layer 125A and the bottom surface of the first protective layer 125A (or the top surface of the fifth insulating layer 117) meet each other may be spaced apart from a point (for example, the fourth edge E4) where the side surface 200S and a bottom surface of the first pixel electrode 200A meet each other by the second distance d2 in the horizontal direction (for example, the x or y direction).

The first inclination angle α between the second side surface 125S2 of the first protective layer 125A and the bottom surface of the first protective layer 125A (or the top surface of the fifth insulating layer 117) may be about 45° to about 60°.

The first pixel electrode 200A may include the first to third layers 201, 202, and 203 as described with reference to FIG. 5B, and materials thereof may be the same as those described with reference to FIG. 4. As shown in FIG. 5B, the first protective layer 125A may directly contact a side surface of each of the first to third layers 201, 202, and 203. A structure described with reference to FIG. 5B may correspond to other protective layers and other pixel electrodes.

FIGS. 6 to 10 are schematic cross-sectional views schematically illustrating a process of forming a display apparatus, according to an embodiment.

Figure 6:
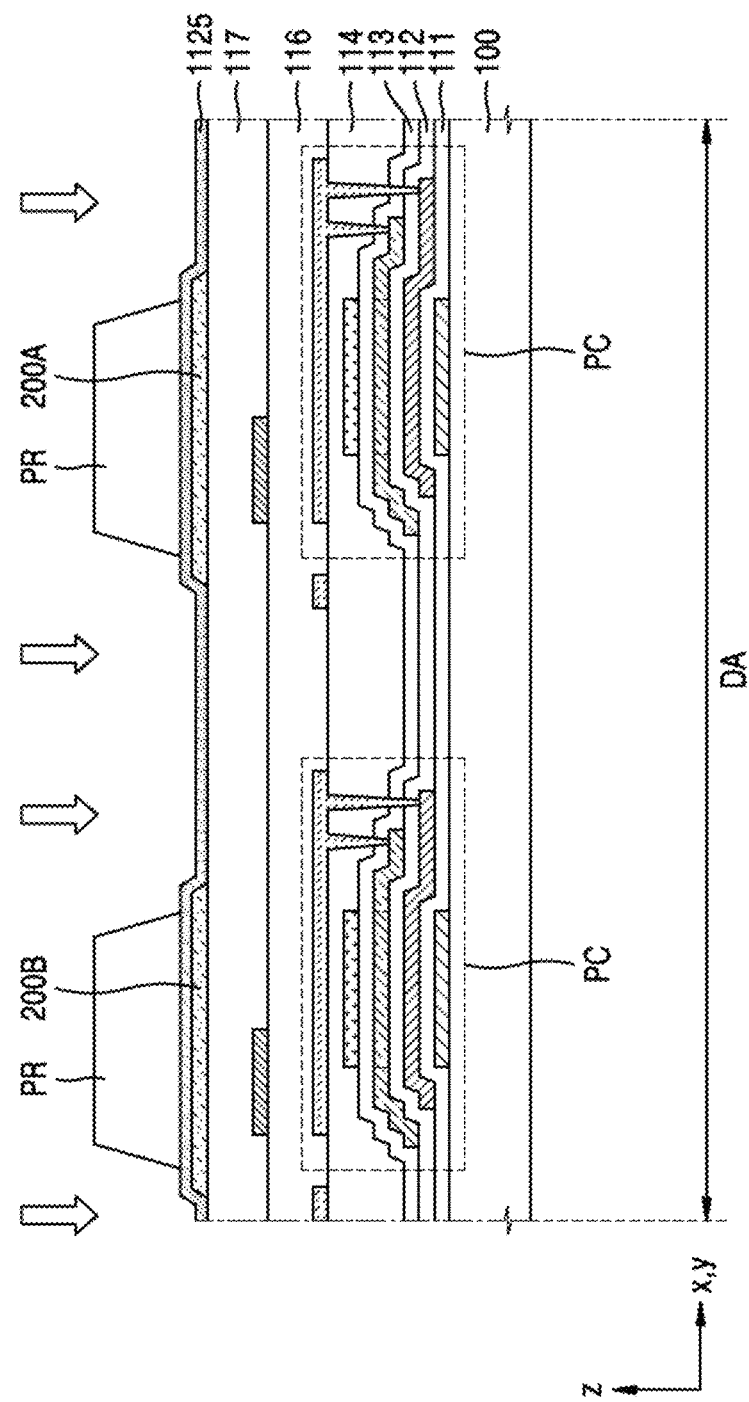
FIGS. 6 to 10 are schematic cross-sectional views schematically illustrating a process of forming a display apparatus, according to an embodiment.

Referring to FIG. 6, the pixel circuits PC are formed on the substrate 100. The substrate 100, a structure of the pixel circuit PC, the buffer layer 111, and the first to fifth insulating layers 112, 113, 114, 116, and 117 may be the same as described with reference to FIG. 2.

The first pixel electrode 200A and the second pixel electrode 200B may be formed on the fifth insulating layer 117. The first pixel electrode 200A and the second pixel electrode 200B may be spaced apart from each other, and each of the first pixel electrode 200A and the second pixel electrode 200B may be electrically connected to the pixel circuit PC.

Each of the first pixel electrode 200A and the second pixel electrode 200B may include a metal film and a conductive oxide film located over and under the metal film. The metal film may include silver (Ag), magnesium (Mg), aluminum (Al), platinum (Pt), palladium (Pd), gold (Au), nickel (Ni), neodymium (Nd), iridium (Ir), chromium (Cr), or a compound thereof. The conductive oxide film may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, each of the first pixel electrode 200A and the second pixel electrode 200B may have a three-layer structure in which an indium tin oxide (ITO) layer, a silver (Ag) layer, and an indium tin oxide (ITO) layer are stacked each other.

A preliminary protective layer 1125 is formed on the first pixel electrode 200A and the second pixel electrode 200B. The preliminary protective layer 1125 may include a metal oxide. In an embodiment, the preliminary protective layer 1125 may include zinc oxide (ZnO). By way of example, the preliminary protective layer 1125 may include zinc oxide and at least one selected from among indium oxide (InO), gallium oxide (GaO), and tin oxide (SnO). The content (at %) of the at least one selected from among indium oxide (InO), gallium oxide (GaO), and tin oxide (SnO) included in the preliminary protective layer 1125 may be less than the content (at %) of zinc oxide included in the preliminary protective layer 1125. In other words, the content (at %) of zinc oxide included in the preliminary protective layer 1125 may be greater than the content of other metal oxides.

Photoresists PR are formed on the preliminary protective layer 1125. The photoresists PR may overlap the first pixel electrode 200A and the second pixel electrode 200B. In an embodiment, a width of the photoresist PR may be less than a width of a pixel electrode located under the photoresist PR. A part of the preliminary protective layer 1125 not overlapping the photoresist PR may be removed. A part of the preliminary protective layer 1125 may be removed through etching (for example, wet etching). As a part of the preliminary protective layer 1125 is removed, a protective layer may be formed on each pixel electrode. In this regard, in FIG. 7, the first protective layer 125A on the first pixel electrode 200A and the second protective layer 125B on the second pixel electrode 200B are formed. A first stacked structure of the first pixel electrode 200A and the first protective layer 125A and a second stacked structure of the second pixel 200B and the second protective layer 125B may be spaced apart from each other. A width of the first protective layer 125A may be less than a width of a top surface of the first pixel electrode 200A, and a width of the second protective layer 125B may be less than a width of a top surface of the second pixel electrode 200B.

Figure 7:
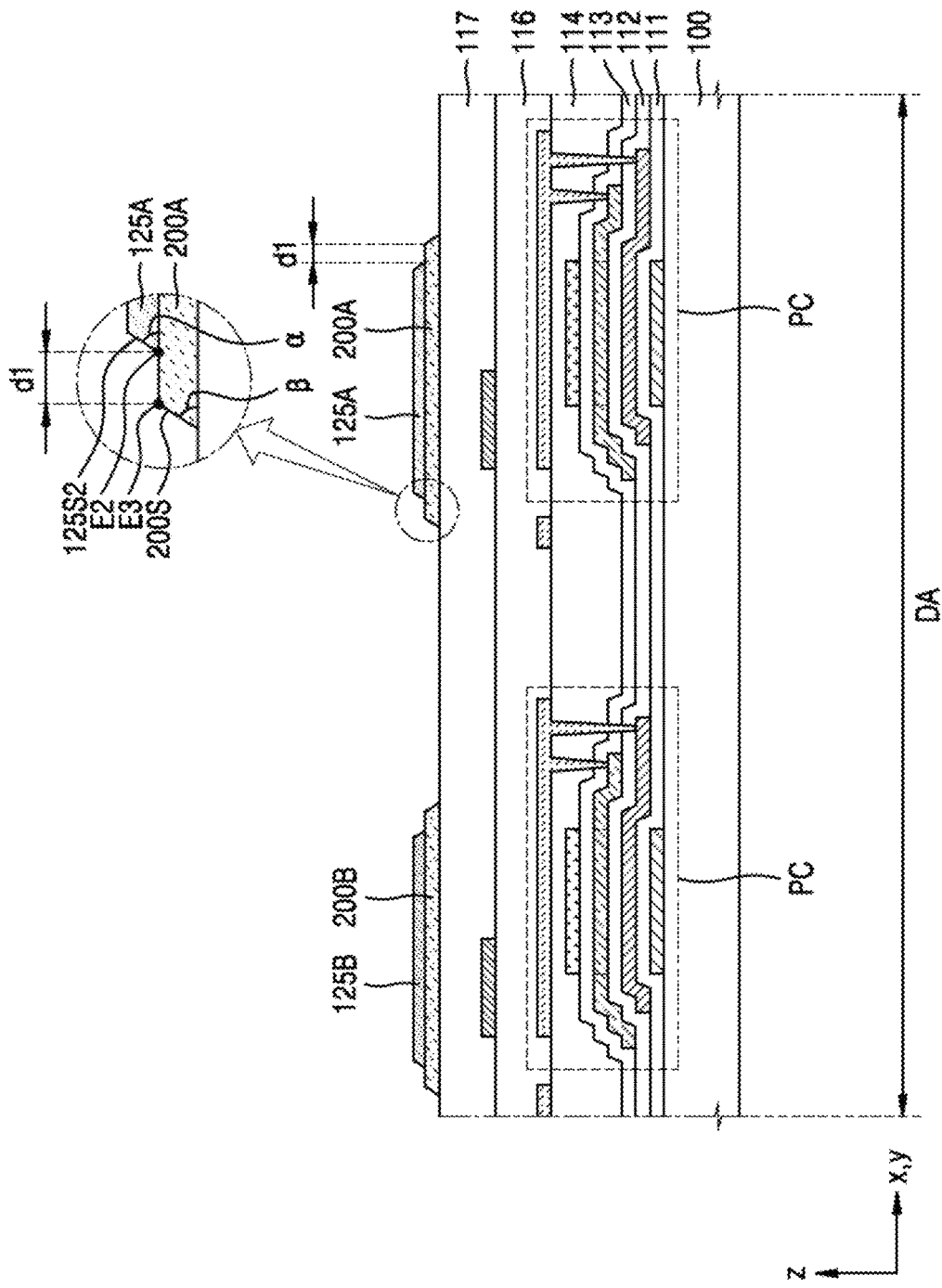

As shown in an enlarged view of FIG. 7, the second edge E2 where the second side surface 125S2 and a bottom surface of the first protective layer 125A meet each other may be spaced apart from the third edge E3 where the top surface and the side surface 200S of the first pixel electrode 200A meet each other by the first distance d1 along the horizontal direction (for example, the x or y direction).

The first inclination angle α of the second side surface 125S2 of the first protective layer 125A may be the same as or different from the second inclination angle β of the side surface 200S of the first pixel electrode 200A. The first inclination angle α of the second side surface 125S2 of the first protective layer 125A with respect to the bottom surface of the first protective layer 125A and/or the second inclination angle β of the side surface 200S of the first pixel electrode 200A with respect to a bottom surface of the first pixel electrode 200A (or a top surface of the fifth insulating layer 117) may be about 45° to about 60°.

The first pixel electrode 200A may include layers, for example, the first to third layers 201, 202, and 203 (see FIG. 4), as described with reference to FIG. 4, and the features of the first to third layers 201, 202, and 203 (see FIG. 4) may be the same as those described with reference to FIG. 4.

The second stacked structure of the second pixel electrode 200B and the second protective layer 125B is the same as the first stacked structure of the first pixel electrode 200A and the first protective layer 125A, and thus, a repeated description may be omitted.

Figure 8:
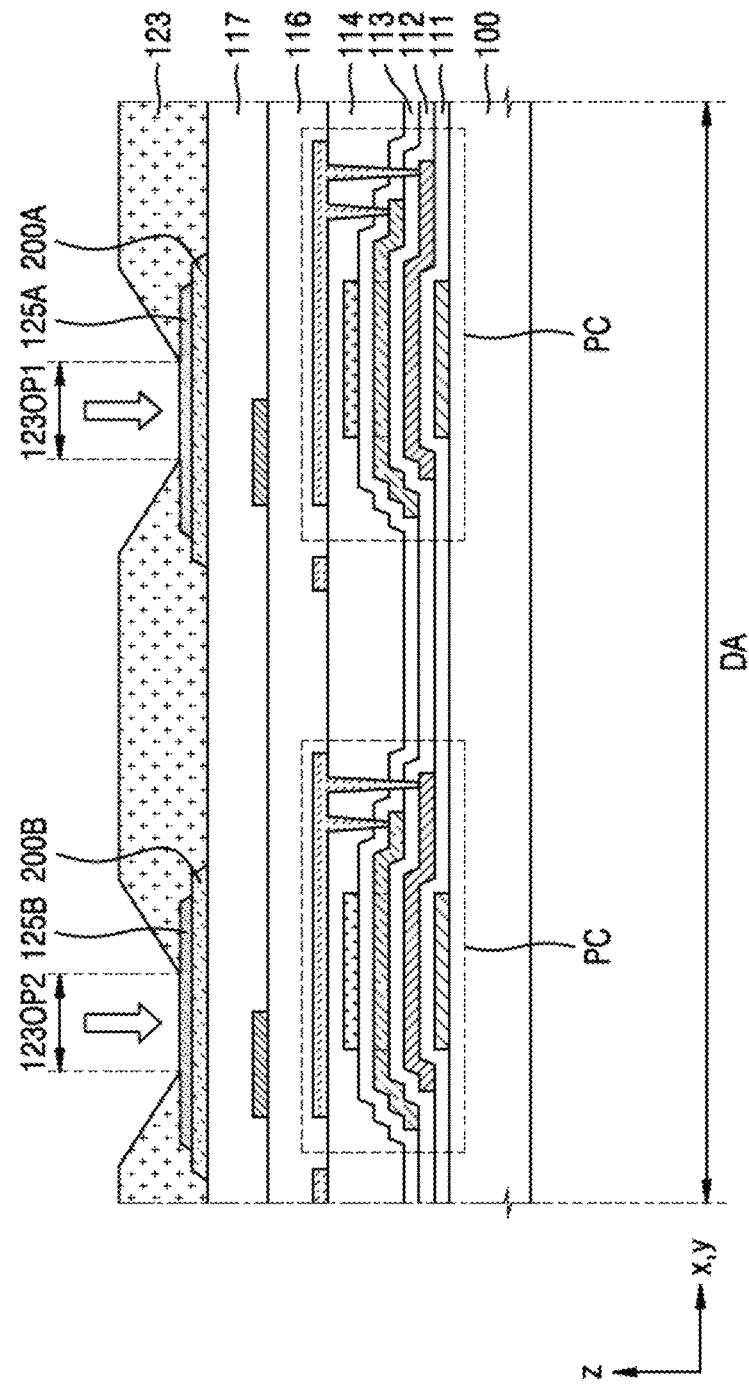

Referring to FIG. 8, the bank layer 123 may be formed to cover a side surface of each of the first stacked structure and the second stacked structure. The bank layer 123 may directly contact the second side surface 125S2 (see FIG. 7) of the first protective layer 125A and the side surface 200S (see FIG. 7) of the first pixel electrode 200A corresponding to the first stacked structure. Likewise, the bank layer 123 may directly contact a second side surface of the second protective layer 125B and a side surface of the second pixel electrode 200B corresponding to the second stacked structure.

The bank layer 123 may have an opening overlapping a pixel electrode. In this regard, in FIG. 8, the bank layer 123 may include the first opening 123OP1 overlapping the first pixel electrode 200A and the second opening 123OP2 overlapping the second pixel electrode 200B.

The bank layer 123 may include an organic insulating material, for example, an organic insulating material including a light-blocking material. In an embodiment, the bank layer 123 may include a polyimide (PI)-based binder, and a pigment in which red, green, and blue colors are mixed. By way of example, the bank layer 123 may include a cardo-based binder resin, and a mixture of a lactam black pigment and a blue pigment. By way of example, the bank layer 123 may include carbon black.

After the bank layer 123 is formed, a part of a protective layer may be removed through the opening of the bank layer 123. A part of the first protective layer 125A may be removed through the first opening 123OP1, and a part of the second protective layer 125B may be removed through the second opening 123OP2. As a part of the first protective layer 125A and a part of the second protective layer 125B are removed, each of the first protective layer 125A and the second protective layer 125B may have a closed loop shape (or a frame shape) in a plan view.

A part of the first protective layer 125A and a part of the second protective layer 125B may be removed through etching (for example, wet etching). The area of the removed part of the first protective layer 125A may be greater than the area of the first opening 123OP1, and the area of the removed part of the second protective layer 125B may be greater than the area of the second opening 123OP2. In other words, a portion of the first protective layer 125A overlapping the first opening 123OP1 and a surrounding portion thereof may be removed, and a portion of the second protective layer 125B overlapping the second opening 123OP2 and a surrounding portion thereof may be removed. Accordingly, the bank layer 123 may include the overhang portion 123P as shown in FIG. 9.

Figure 9:
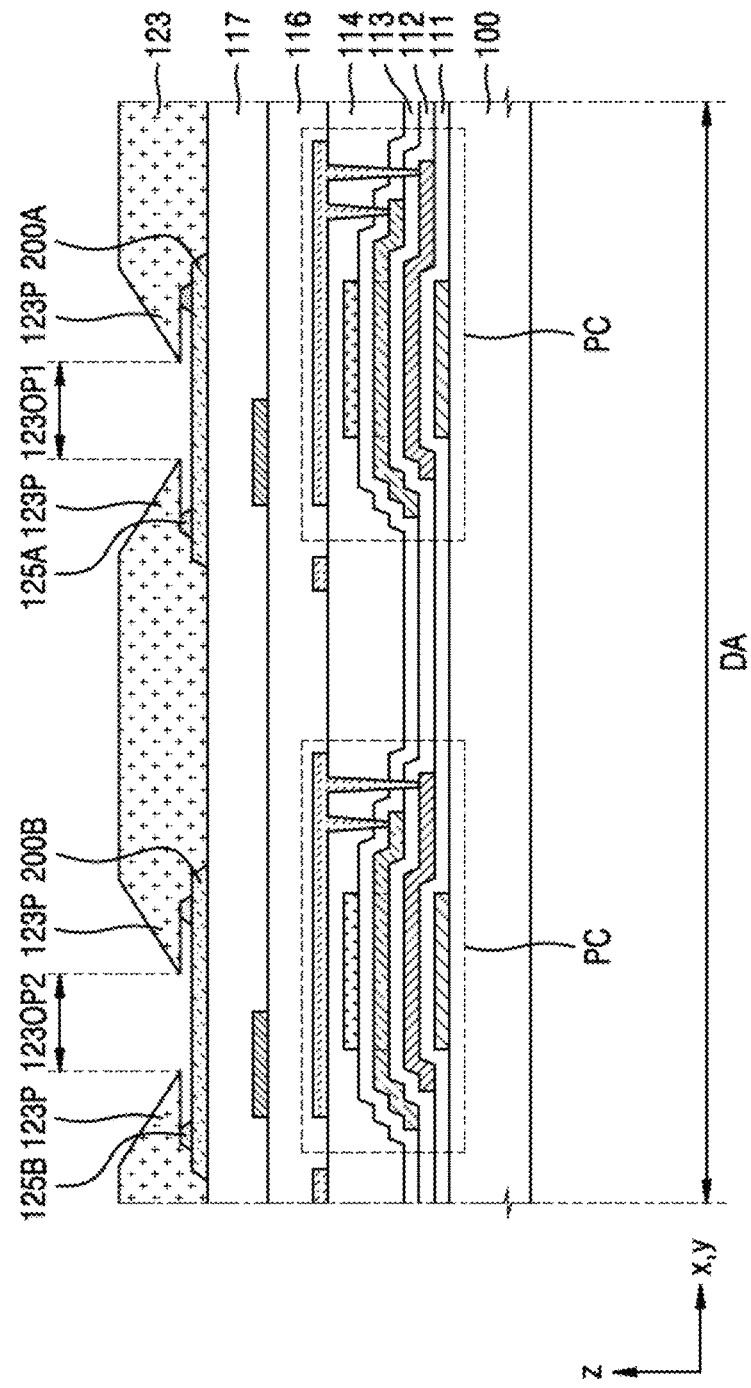

Referring to FIG. 9, the overhang portion 123P may overlap an outer portion of each of the first pixel electrode 200A and the second pixel electrode 200B, and features of a horizontal length and a vertical distance of the overhang portion 123P are the same as those described with reference to FIG. 3.

Figure 10:
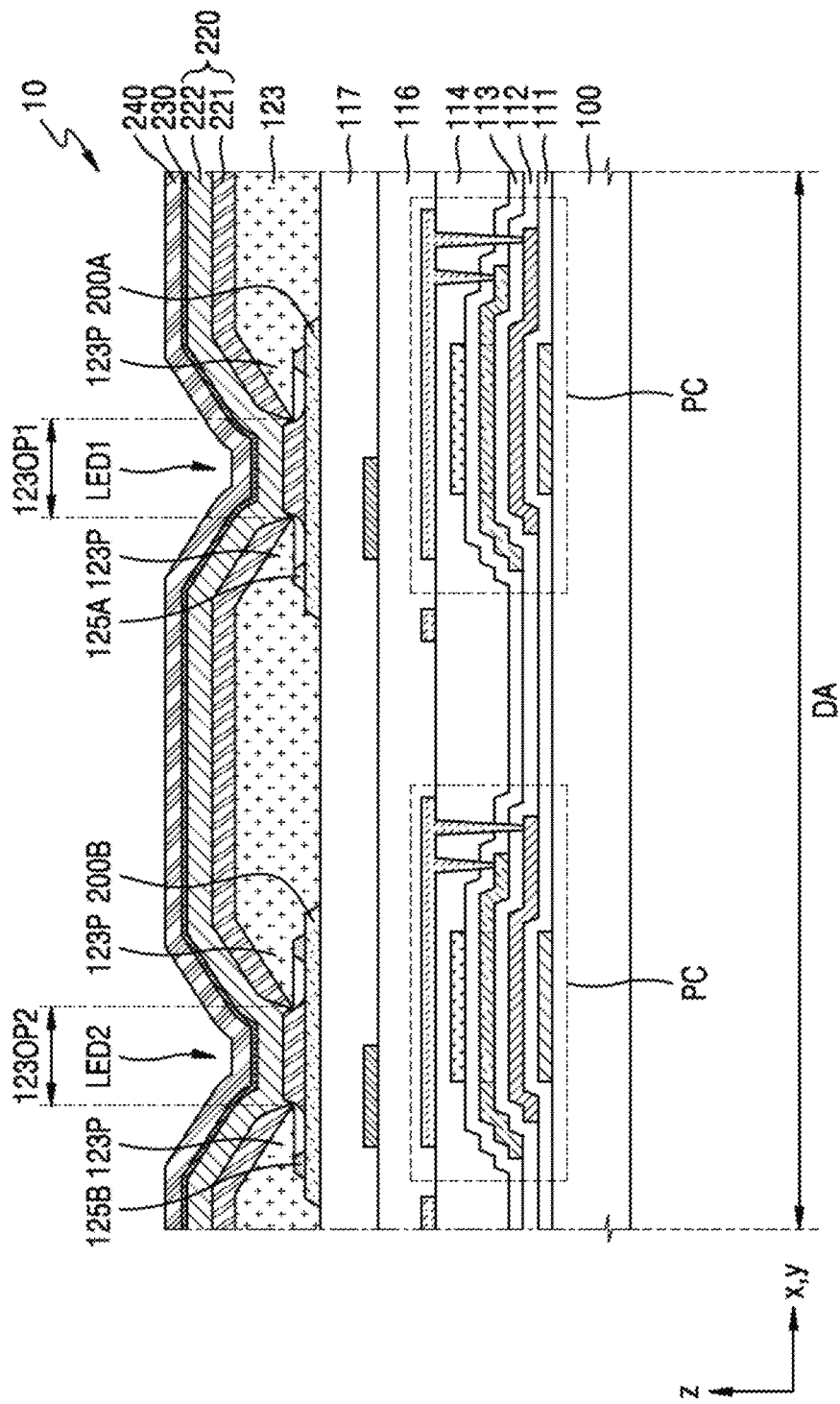

Referring to FIG. 10, the intermediate layer 220, the counter electrode 230, and the upper layer 240 may be formed on the bank layer 123 including the overhang portion 123P. Each of the intermediate layer 220, the counter electrode 230, and the upper layer 240 may be formed through chemical vapor deposition.

The intermediate layer 220 may include sub-layers. Some or all of the sub-layers may be separated around the overhang portion 123P. In an embodiment, in FIG. 10, some sub-layers 221 of the layers included in the intermediate layer 220 are separated around the overhang portion 123P, and the remaining sub-layers 222 of the layers included in the intermediate layer 220 are continuously formed. A structure of the intermediate layer 220 may be the same as that described with reference to FIG. 3, and thus, a repeated description may be omitted.

The counter electrode 230 and the upper electrode 240 may be continuously formed without being separated around the overhang portion 123P.

According to an embodiment described with reference to FIGS. 5 to 10, although the photoresist PR illustrated in FIG. 6 is formed to have a width less than a width of a pixel electrode, and thus, the first protective layer 125A is located on the first pixel electrode 200A and the second edge E2 of a side surface of the first protective layer 125A is spaced apart from the third edge E3 of a side surface of the first pixel electrode 200A by the first distance d1, the disclosure is not limited thereto. A width of the photoresist PR may be changed, as in a process described below with reference to FIGS. 11A to 11D.

FIGS. 11A to 11D are schematic cross-sectional views illustrating some processes of a method of manufacturing a display apparatus, according to an embodiment. FIGS. 11A to 11D are schematic cross-sectional views illustrating a process of forming the first stacked structure including the first pixel electrode 200A and the first protective layer 125A on the first pixel electrode 200A and the second stacked structure including the second pixel electrode 200B and the second protective layer 125B on the second pixel electrode 200B, and a process of forming the bank layer 123 including the overhang portion 123P.

Figure 11A:
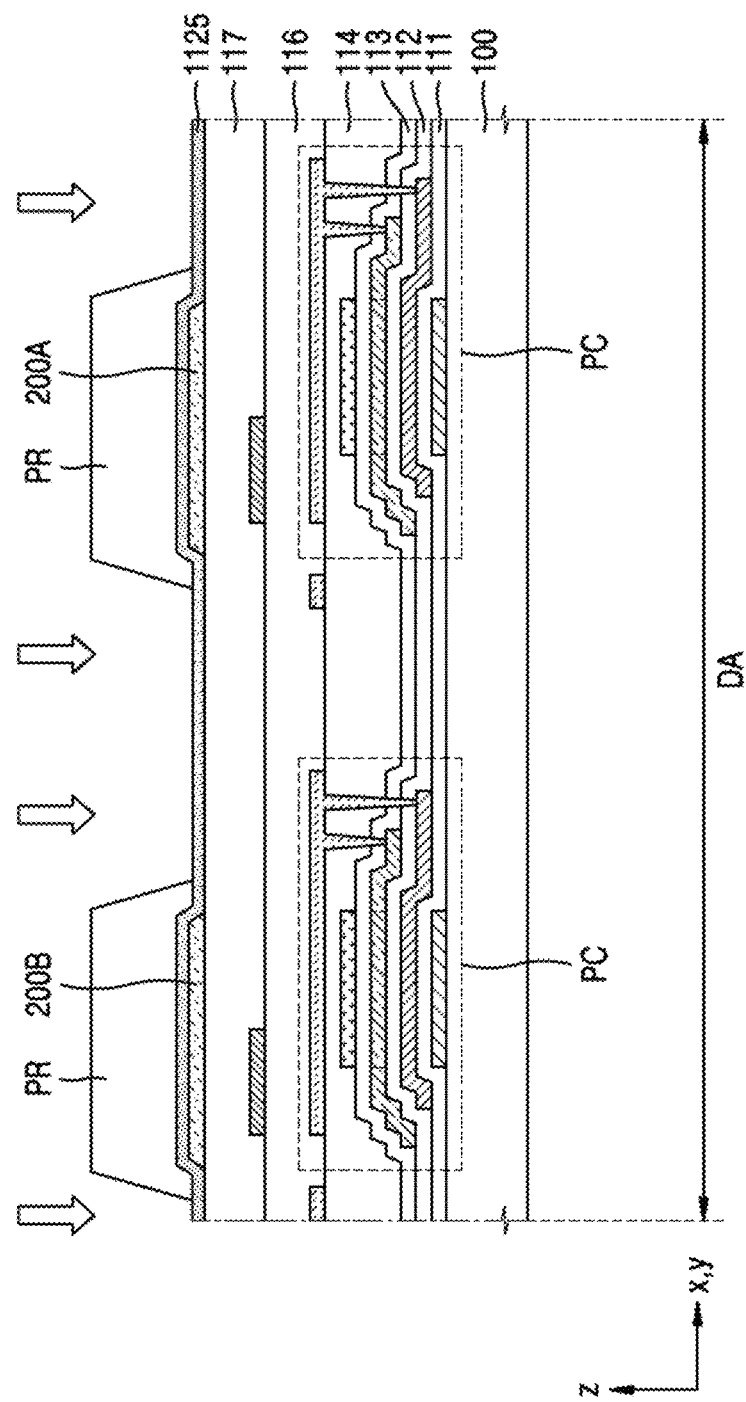
FIGS. 11A to 11D are schematic cross-sectional views illustrating processes of a method of manufacturing a display apparatus, according to an embodiment.

Referring to FIG. 11A, the first pixel electrode 200A and the second pixel electrode 200B, which are spaced apart from each other, may be formed, and the preliminary protective layer 1125 may be formed on the first pixel electrode 200A and the second pixel electrode 200B.

A width of each of the photoresists PR located on the preliminary protective layer 1125 for patterning the preliminary protective layer 1125 may be greater than a width of a pixel electrode located under the photoresist PR.

A part of the preliminary protective layer 1125 not overlapping the photoresist PR may be removed. As a part of the preliminary protective layer 1125 is removed, as shown in FIG. 11B, the first protective layer 125A and the second protective layer 125B may be respectively formed on the first pixel electrode 200A and the second pixel electrode 200B.

Figure 11B:
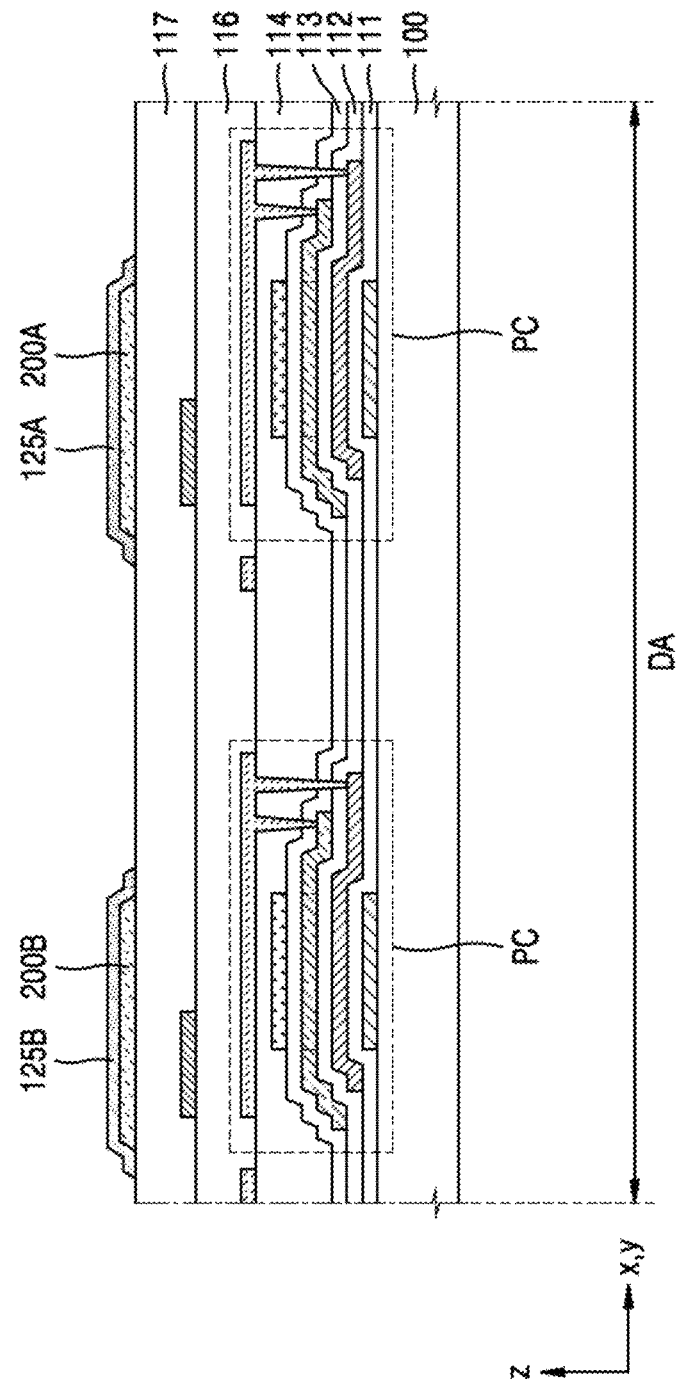

Referring to FIG. 11B, a width of the first protective layer 125A may be greater than a width of the first pixel electrode 200A, and a width of the second protective layer 125B may be greater than a width of the second pixel electrode 200B. The first protective layer 125A may extend past a side surface of the first pixel electrode 200A to the fifth insulating layer 117, and the second protective layer 125B may extend past a side surface of the second pixel electrode 200B to the fifth insulating layer 117.

Figure 11C:
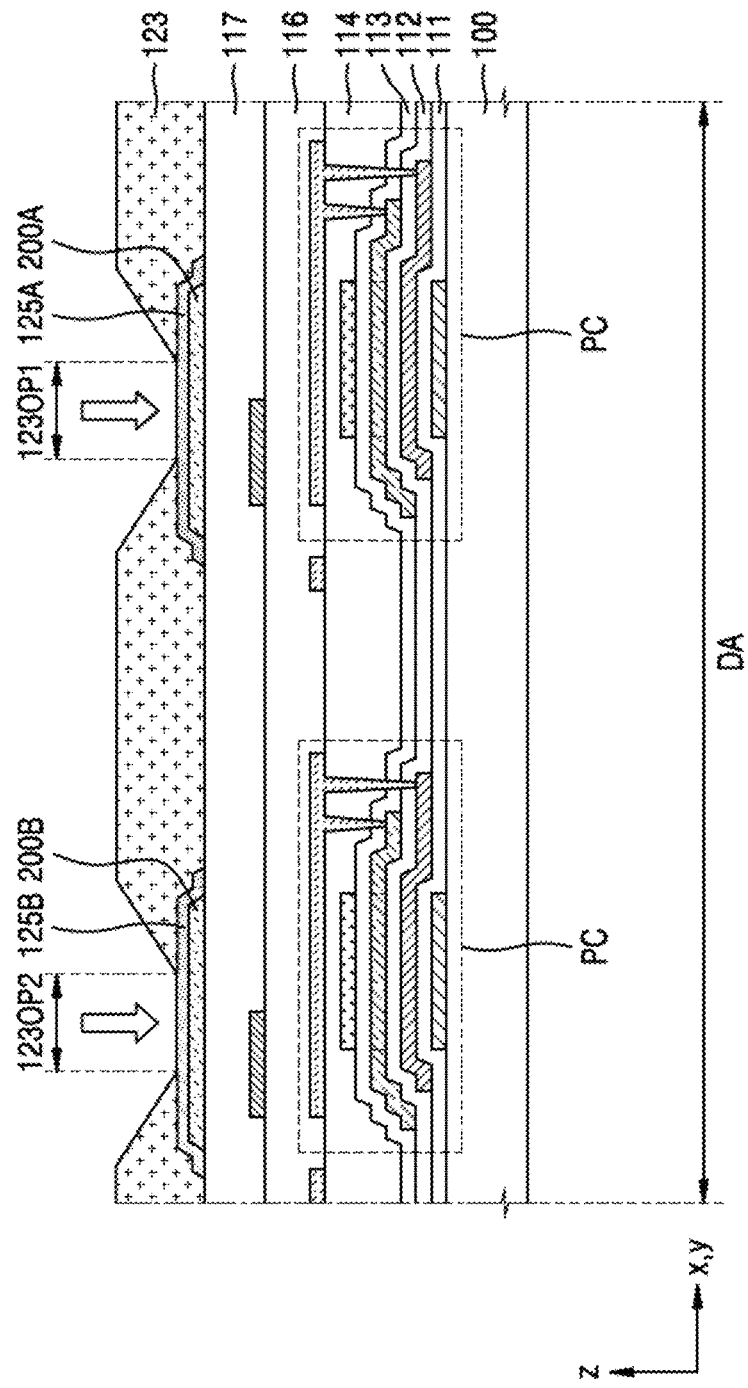

Referring to FIG. 11C, the bank layer 123 may be formed to cover a side surface of each of the first stacked structure of the first pixel electrode 200A and the first protective layer 125A and the second stacked structure of the second pixel electrode 200B and the second protective layer 125B. The bank layer 123 may include the first opening 123OP1 overlapping the first pixel electrode 200A and the second opening 123OP2 overlapping the second pixel electrode 200B.

A part of the first protective layer 125A may be removed through the first opening 123OP1 of the bank layer 123, and a part of the second protective layer 125B may be removed through the second opening 123OP2. A part of the first protective layer 125A and a part of the second protective layer 125B may be removed through etching (for example, wet etching). The area of the removed part of the first protective layer 125A may be greater than the area of the first opening 123OP1, and the area of the removed part of the second protective layer 125B may be greater than the area of the second opening 123OP2. In other words, a portion of the first protective layer 125A overlapping the first opening 123OP1 and a surrounding portion thereof may be removed, and a portion of the second protective layer 125B overlapping the second opening 123OP2 and a surrounding portion thereof may be removed. Accordingly, the bank layer 123 may include the overhang portion 123P as shown in FIG. 11D.

Figure 11D:
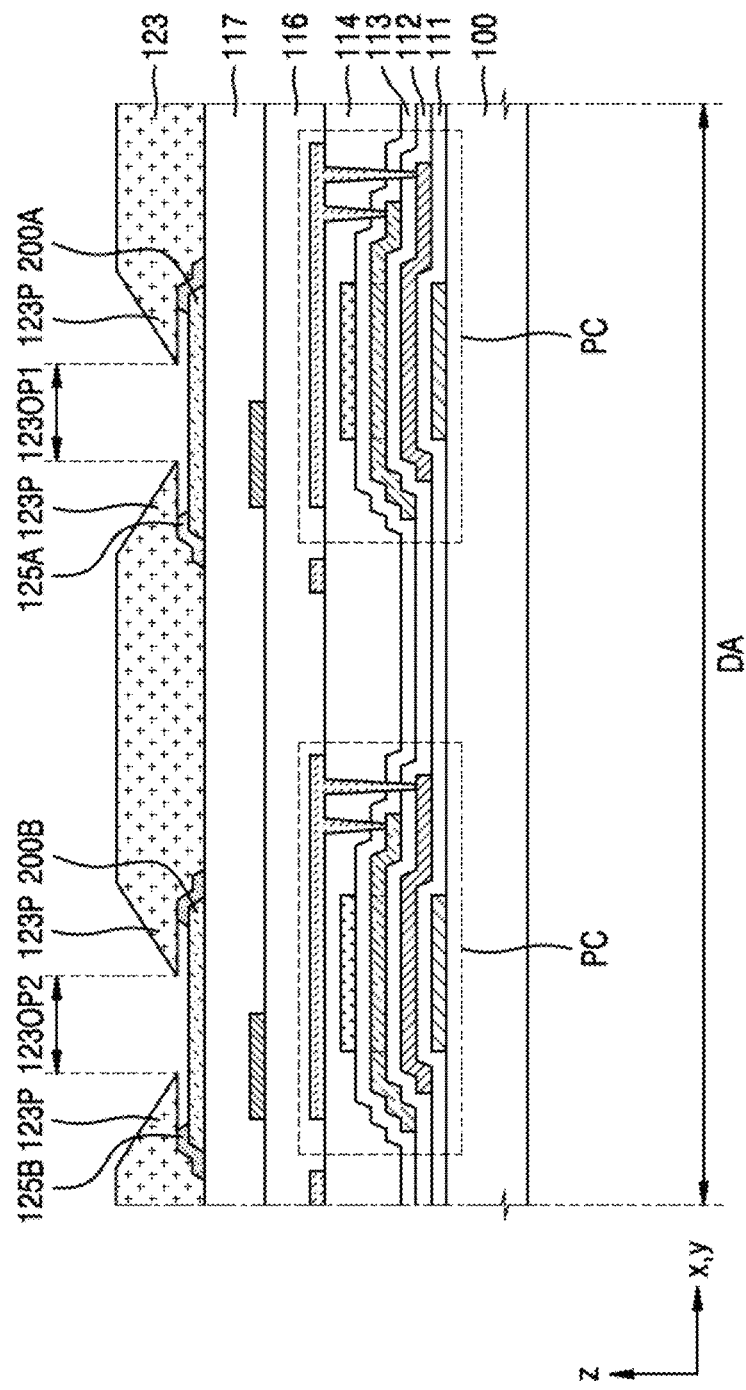

After the bank layer 123 including the overhang portion 123P is formed as shown in FIG. 11D, an intermediate layer, a counter electrode, and an upper layer may be sequentially formed, and a structure thereof is the same as that described with reference to FIGS. 5A and 5B.

According to embodiments described with reference to FIGS. 6 to 10 and 11A to 11D, although the first and second pixel electrodes 200A and 200B are formed and the first and second protective layers 125A and 125B, the disclosure is not limited thereto. As described below with reference to FIGS. 12A to 12D, the first and second protective layers 125A and 125B may be first patterned and the first and second pixel electrodes 200A and 200B may be formed.

FIGS. 12A to 12D illustrate processes of a method of manufacturing a display apparatus, according to an embodiment. For example, FIGS. 12A to 12D are schematic cross-sectional views illustrating a process of forming a protective layer and a pixel electrode.

Figure 12A:
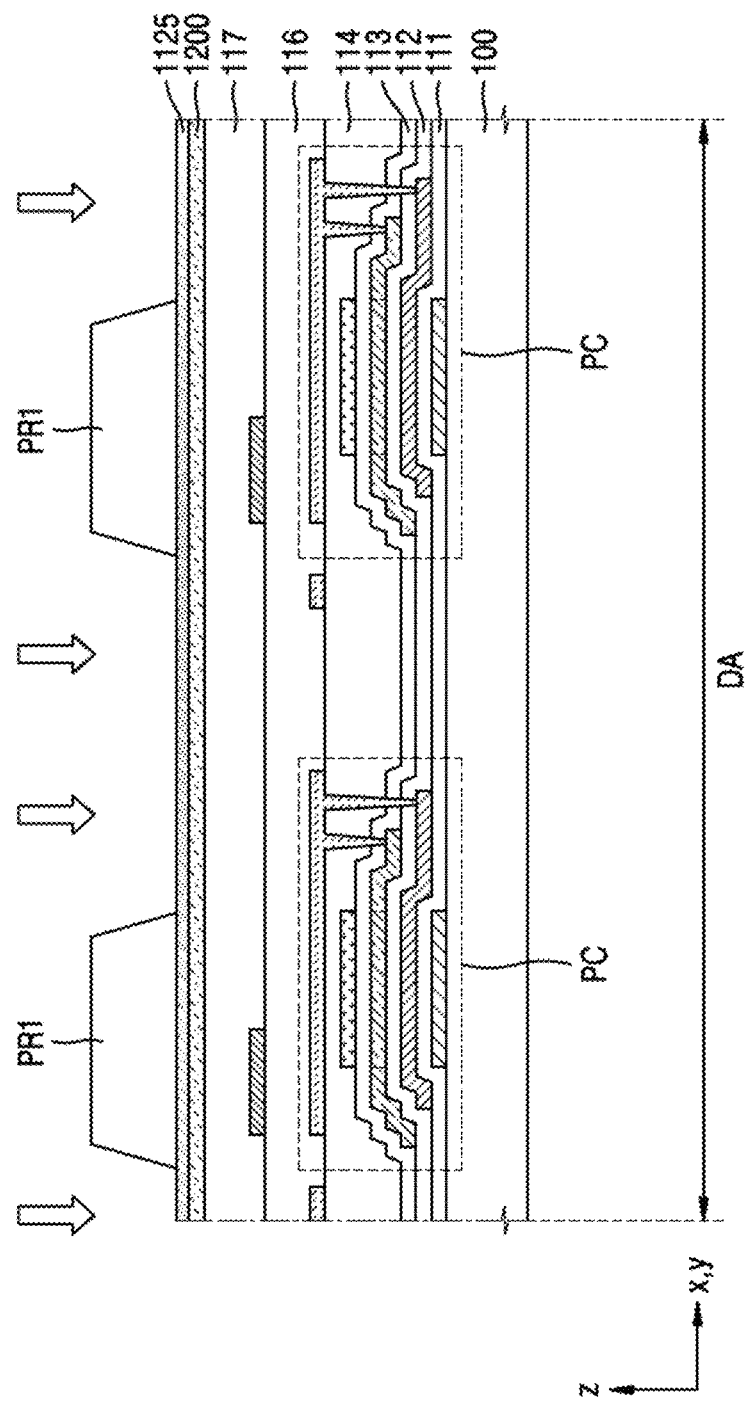
FIGS. 12A to 12D illustrate processes of a method of manufacturing a display apparatus, according to an embodiment.

Referring to FIG. 12A, the pixel circuits PC may be formed on the substrate 100, and an electrode layer 1200 may be formed on the fifth insulating layer 117. Although not shown in FIG. 12A, the electrode layer 1200 may be electrically connected to a transistor of the pixel circuit PC.

The electrode layer 1200 may include layers. For example, the electrode layer 1200 may include a metal film, and a conductive oxide film located over and under the metal film. The metal film may include silver (Ag), magnesium (Mg), aluminum (Al), platinum (Pt), palladium (Pd), gold (Au), nickel (Ni), neodymium (Nd), iridium (Ir), chromium (Cr), or a compound thereof. The conductive oxide film may indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the electrode layer 1200 may have a three-layer structure in which an indium tin oxide (ITO) layer, a silver (Ag) layer, and an indium tin oxide (ITO) layer are stacked each other.

Figure 12B:
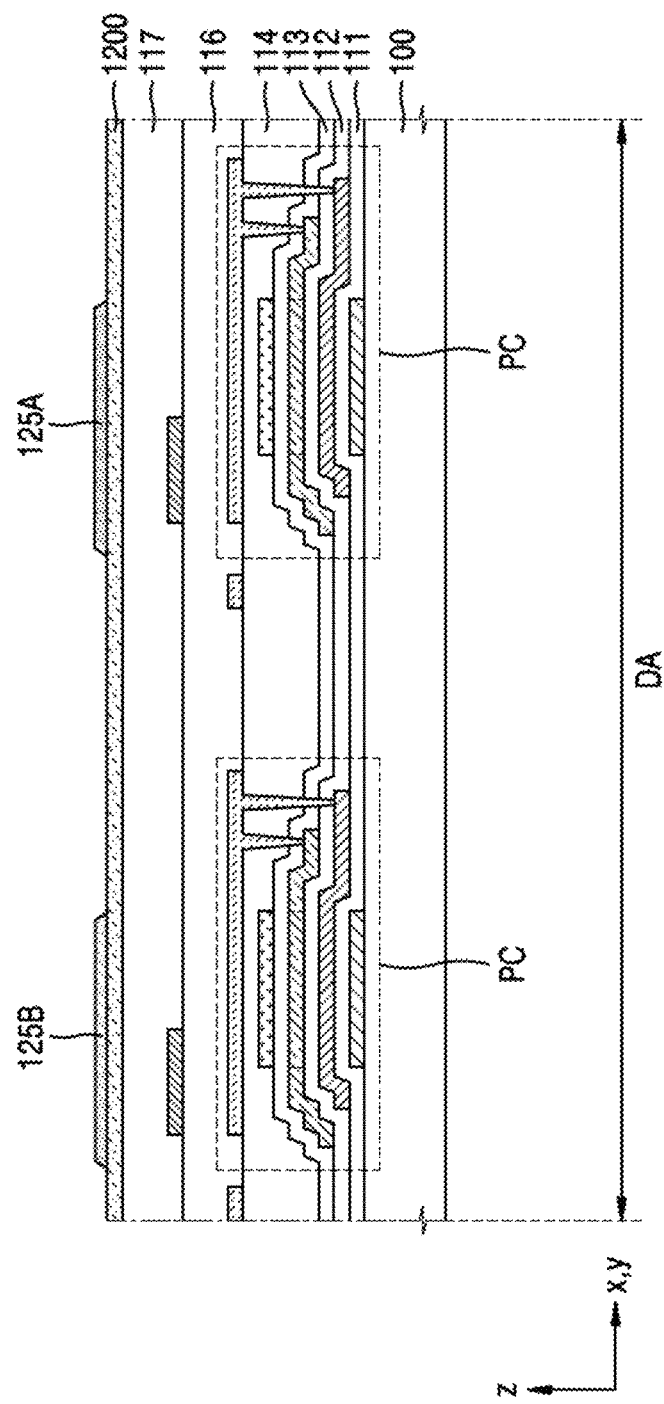

The preliminary protective layer 1125 is formed on the electrode layer 1200. The preliminary protective layer 1125 may include a metal oxide as described above. First photoresists PR1 may be located on the preliminary protective layer 1125 to be spaced apart from each other, and the preliminary protective layer 1125 may be etched by using each of the first photoresists PR1. The first protective layer 125A and the second protective layer 125B, which are spaced apart from each other, may be formed on the electrode layer 1200 through etching of the preliminary protective layer 1125 as shown in FIG. 12B.

Figure 12C:
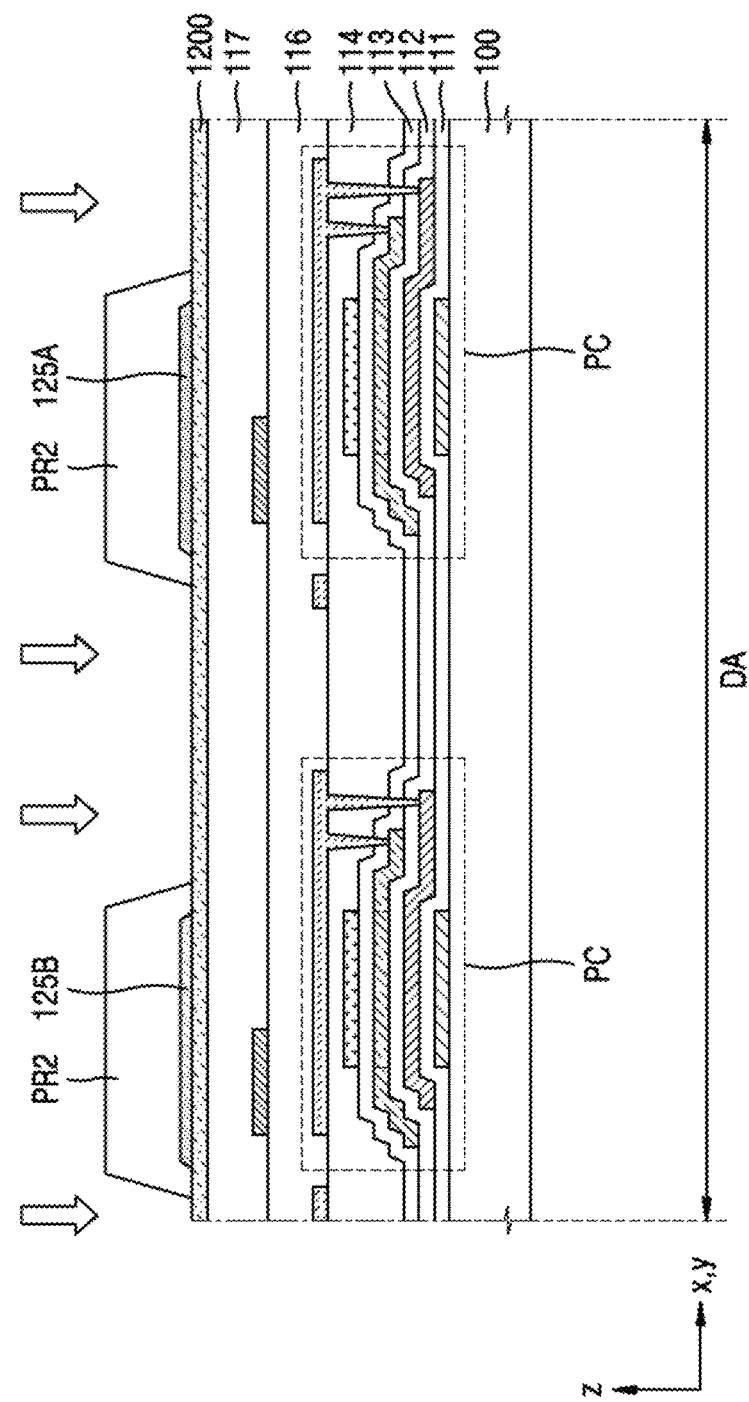

Referring to FIG. 12C, second photoresists PR2 may be formed to respectively cover the first protective layer 125A and the second protective layer 125B. The second photoresists PR2 may be spaced apart from each other. A width of each of the second photoresists PR2 may be greater than a width of each of the first protective layer 125A and the second protective layer 125B. Accordingly, both a top surface and a side surface of each of the first protective layer 125A and the second protective layer 125B may contact and be covered by the second photoresist PR2.

Figure 12D:
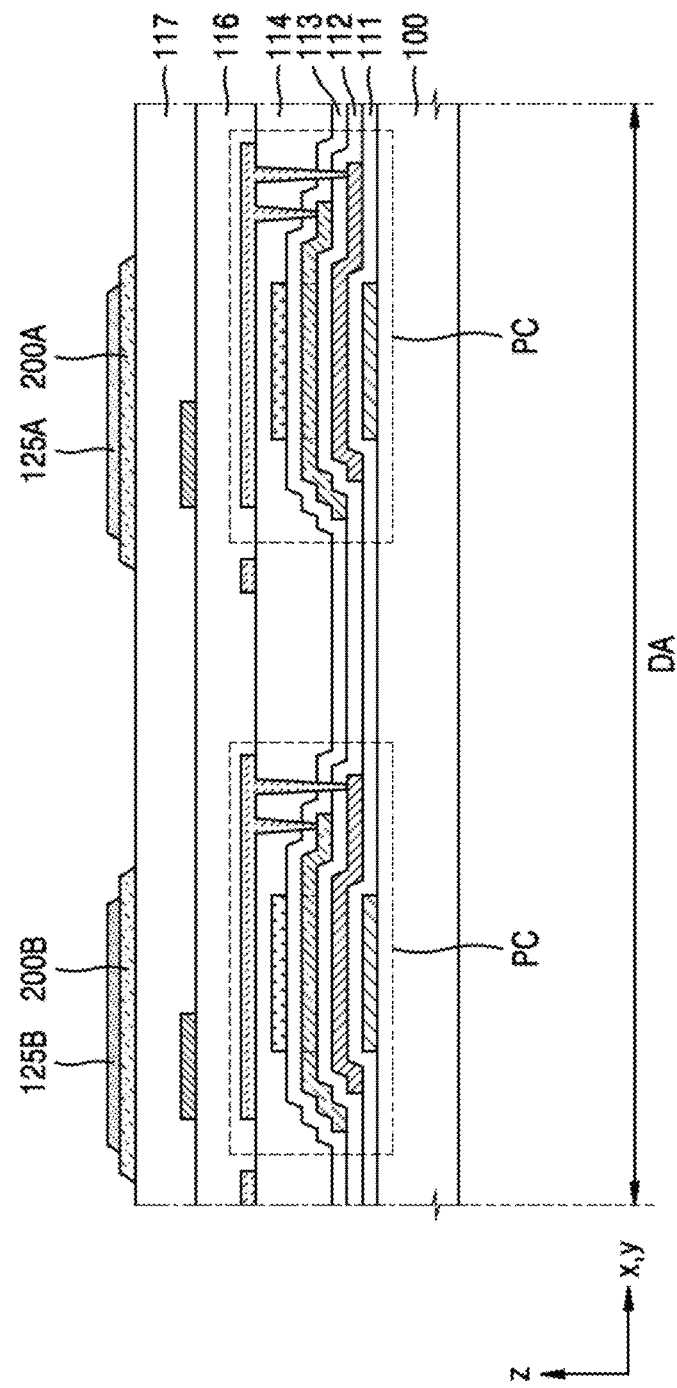

As shown in FIG. 12D, the first pixel electrode 200A and the second pixel electrode 200B may be formed by removing a part of the electrode layer 1200 not overlapping the second photoresist PR2. A width of the first pixel electrode 200A may be greater than a width of the first protective layer 125A, and a width of the second pixel electrode 200B may be greater than a width of the second protective layer 125B. Structures of the first pixel electrode 200A and the first protective layer 125A, and the second pixel electrode 200B and the second protective layer 125B illustrated in FIG. 12D may be the same as those described with reference to FIG. 7.

A process of forming a bank layer including an overhang portion and forming an intermediate layer, a counter electrode, and an upper layer is the same as that described with reference to FIGS. 8 to 10, and thus, a repeated description may be omitted.

According to embodiments described above, because a pixel electrode and a protective layer are formed together by using the photoresist PR and the protective layer is etched by using the bank layer 123 as a mask, a material, for example, silver (Ag), included in the pixel electrode may be prevented from being released during an etching process and contaminating the display apparatus 10. Also, because a charge generation layer included in the intermediate layer 220 formed through the above process is separated around the overhang portion 123P, leakage of current through the charge generation layer may be prevented. Because the counter electrode 230 is continuously formed without being separated unlike the charge generation layer, a voltage drop due to the resistance of the counter electrode 230 itself may be prevented.

Figure 13:
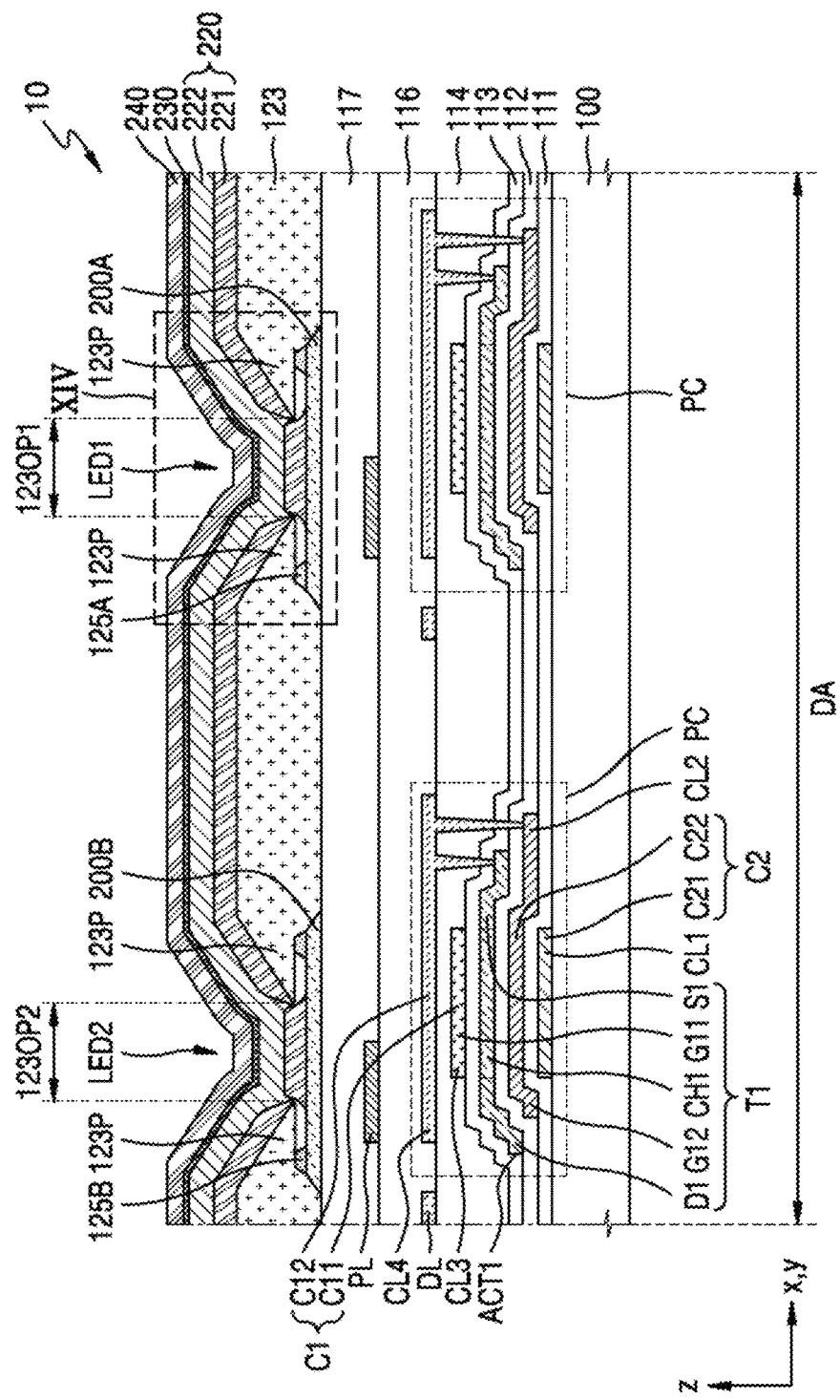
FIG. 13 is a schematic cross-sectional view illustrating a part of a display apparatus, according to an embodiment.

FIG. 13 is a schematic cross-sectional view illustrating a part of the display apparatus 10, according to an embodiment.

Referring to FIG. 13, the display apparatus 10 may include the substrate 100, the pixel circuits PC located on the substrate 100, and light-emitting diodes respectively electrically connected to the pixel circuits PC. In this regard, FIG. 13 illustrates two light-emitting diodes, for example, the first and second light-emitting diodes LED1 and LED2.

The substrate 100 may include a glass material or a polymer resin. In an embodiment, the substrate 100 may have a structure in which a base layer including a polymer resin and a barrier layer including an inorganic insulating material such as silicon oxide or silicon nitride are alternately stacked each other. Examples of the polymer resin may include polyethersulfone, polyarylate, polyether imide, polyethylene naphthalate, polyethylene terephthalate, polyphenylene sulfide, polyimide, polycarbonate, cellulose triacetate, and cellulose acetate propionate.

The pixel circuit PC may include a transistor and a capacitor, and in this regard, FIG. 13 illustrates the first transistor T1, the first capacitor C1, and the second capacitor C2. The pixel circuit PC may include conductive layers and a semiconductor layer constituting the transistor or the capacitor.

The first conductive layer CL1 may be located on the substrate 100. The first conductive layer CL1 may include a conductive material such as a metal. For example, the first conductive layer CL1 may include a conductive material including molybdenum (Mo), aluminum (Al), copper (Cu), or titanium (Ti) and may have a single or multi-layer structure including the above material.

The buffer layer 111 may be located on the first conductive layer CL1. The buffer layer 111 may include an inorganic insulating material such as silicon oxide, silicon nitride, or silicon oxynitride and may have a single or multi-layer structure including the inorganic insulating material.

The second conductive layer CL2 may be located on the buffer layer 111 and may overlap the first conductive layer CL1. In an embodiment, the first conductive layer CL1 may include the first electrode C21 of the second capacitor C2, and the second conductive layer CL2 may include the second electrode C22 of the second capacitor C2. The second conductive layer CL2 may include a conductive material including molybdenum (Mo), aluminum (Al), copper (Cu), or titanium (Ti) and may have a single or multi-layer structure including the above material.

The first insulating layer 112 may be located on the second conductive layer CL2. The first insulating layer 112 may include an inorganic insulating material such as silicon oxide, silicon nitride, or silicon oxynitride and may have a single or multi-layer structure including the inorganic insulating material.

The semiconductor layer ACT1 may be located on the first insulating layer 112. The semiconductor layer ACT1 may include the channel region CH1, and the source region S1 and the drain region D1 located on both sides of the channel region CH1. The semiconductor layer ACT1 may include an oxide of at least one material selected from the group consisting of indium (In), gallium (Ga), stannum (Sn), zirconium (Zr), vanadium (V), hafnium (Hf), cadmium (Cd), germanium (Ge), chromium (Cr), titanium (Ti), aluminum (Al), cesium (Cs), cerium (Ce), and zinc (Zn). For example, the semiconductor layer ACT1 may be an InSnZnO (ITZO) semiconductor layer or an InGaZnO (IGZO) semiconductor layer. A conductive process by plasma treatment or the like may be performed on at least a part of the semiconductor layer ACT1.

The third conductive layer CL3 may be located on the semiconductor layer ACT1 with the second insulating layer 113 therebetween. A part of the third conductive layer CL3 may overlap the 1-1 gate electrode G11 overlapping the channel region CH1, and a part of the second conductive layer CL2 may include the 1-2 gate electrode G12 overlapping the channel region CH1. The 1-1 gate electrode G11 and the 1-2 gate electrode G12 may overlap each other with the channel region CH1 therebetween. The second insulating layer 113 may include an inorganic insulating material such as silicon oxide, silicon nitride, or silicon oxynitride and may have a single or multi-layer structure including the inorganic insulating material.

The third insulating layer 114 may be located on the third conductive layer CL3. The third insulating layer 114 may include an inorganic material such as silicon oxide, silicon nitride, or silicon oxynitride and may have a single or multi-layer structure including the inorganic insulating material.

The third conductive layer CL3 may include the first electrode C11 of the first capacitor C1, and the fourth conductive layer CL4 on the third insulating layer 114 may include the second electrode C12 of the first capacitor C1. Each of the third conductive layer CL3 and the fourth conductive layer CL4 may include a conductive material molybdenum (Mo), aluminum (Al), copper (Cu), or titanium (Ti) and may have a single or multi-layer structure including the above material.

The data line DL may be located on the third insulating layer 114. The data line DL may include a conductive material including molybdenum (Mo), aluminum (Al), copper (Cu), or titanium (Ti) and may have a single or multi-layer structure including the above material.

The fourth insulating layer 116 may be located on the data line DL. The fourth insulating layer 116 may include an organic insulating material such as acryl, benzocyclobutene (BCB), polyimide, or hexamethyldisiloxane (HMDSO).

The driving voltage line PL may be located on the fourth insulating layer 116 and may be covered by the fifth insulating layer 117. The driving voltage line PL may include a conductive material including molybdenum (Mo), aluminum (Al), copper (Cu), or titanium (Ti) and may have a single or multi-layer structure including the above material. The fifth insulating layer 117 may include an organic insulating material.

A light-emitting diode may include a pixel electrode, a counter electrode, and an intermediate layer located between the pixel electrode and the counter electrode. For example, the first light-emitting diode LED1 may have a stacked structure of the first pixel electrode 200A, the intermediate layer 220, and the counter electrode 230, and the second light-emitting diode LED2 may have a stacked structure of the second pixel electrode 200B, the intermediate layer 220, and the counter electrode 230.

The first pixel electrode 200A and the second pixel electrode 200B may be located on the fifth insulating layer 117 to be spaced apart from each other. Each of the first pixel electrode 200A and the second pixel electrode 200B may include a reflective film including silver (Ag), magnesium (Mg), aluminum (Al), platinum (Pt), palladium (Pd), gold (Au), nickel (Ni), neodymium (Nd), iridium (Ir), chromium (Cr), or a compound thereof. In an embodiment, each of the first pixel electrode 200A and the second pixel electrode 200B may further include a conductive oxide layer over and/or under the reflective film.

The bank layer 123 may be located on the first pixel electrode 200A and the second pixel electrode 200B. The bank layer 123 may include the first opening 123OP1 and the second opening 123OP2 respectively overlapping the first pixel electrode 200A and the second pixel electrode 200B. The bank layer 123 may include an organic insulating material. For example, the bank layer 123 may include an organic insulating material including a light-blocking material. In an embodiment, the bank layer 123 may include a polyimide (PI)-based binder, and a pigment in which red, green, and blue colors are mixed. By way of example, the bank layer 123 may include a cardo-based binder resin, and a mixture of a lactam black pigment and a blue pigment. By way of example, the bank layer 123 may include carbon black. The bank layer 123 may improve the contrast of the display apparatus 10.

The bank layer 123 may include the overhang portion 123P located on (for example over) a top surface of the first pixel electrode 200A and the second pixel electrode 200B. Each overhang portion 123P may overlap an outer portion of each of the first pixel electrode 200A and the second pixel electrode 200B. In other words, an inner portion of the first pixel electrode 200A may overlap the first opening 123OP1 and the outer portion of the first pixel electrode 200A may overlap the overhang portion 123P. The overhang portion 123P overlapping the first pixel electrode 200A may be spaced apart from the top surface of the first pixel electrode 200A along a direction (for example, the z direction) perpendicular to the top surface of the first pixel electrode 200A. An inner portion of the second pixel electrode 200B may overlap the second opening 123OP2, and the outer portion of the second pixel electrode 200B may overlap the overhang portion 123P. The overhang portion 123P overlapping the second pixel electrode 200B may be spaced apart from the top surface of the second pixel electrode 200B along a direction (for example, the z direction) perpendicular to the topo surface of the second pixel electrode 200B.

The first protective layer 125A and the second protective layer 125B may be respectively located on the first pixel electrode 200A and the second pixel electrode 200B. The first protective layer 125A and the second protective layer 125B may be respectively located on the outer portions of the first pixel electrode 200A and the second pixel electrode 200B and may have a closed loop shape (or a frame shape) in a plan view.

The first protective layer 125A may be disposed between the first pixel electrode 200A and the overhang portion 123P overlapping the first pixel electrode 200A, and the second protective layer 125B may be disposed between the second pixel electrode 200B and the overhang portion 123P overlapping the second pixel electrode 200B.

Each of the first protective layer 125A and the second protective layer 125B may include a metal oxide. Each of the first protective layer 125A and the second protective layer 125B may include zinc oxide (ZnO). By way of example, each of the first protective layer 125A and the second protective layer 125B may include zinc oxide and at least one selected from among indium oxide (InO), gallium oxide (GaO), and tin oxide (SnO). The content (at %) of at least one selected from among indium oxide (InO), gallium oxide (GaO), and tin oxide (SnO) included in each of the first protective layer 125A and the second protective layer 125B may be less than the content (at %) of zinc oxide.

The overhang portion 123P of the bank layer 123 located on the first pixel electrode 200A may extend past the first protective layer 125A in the horizontal direction (for example, the x or y direction) toward the inner portion of the first pixel electrode 200A. A void (or a gap or a space) may be formed under the overhang portion 123P. Likewise, the overhang portion 123P of the bank layer 123 located on the second pixel electrode 200B may extend past the second protective layer 125B in the horizontal direction (for example, the x or y direction) toward the inner portion of the second pixel electrode 200B, and a void (or a gap or a space) may be formed under the overhang portion 123P.

The intermediate layer 220 may include sub-layers. At least one of the sub-layers may be separated around the overhang portion 123P. In an embodiment, the sub-layers 221 located at relatively low positions from among the sub-layers included in the intermediate layer 220 are separated around the overhang portion 123P, and the sub-layers 222 located at relatively high positions continuously extend without being separated around the overhang portion 123P. The sub-layers 221 located at lower positions may include a first portion and a second portion separated around the overhang portion 123P, and any one of the first portion and the second portion may be located on the top surface of the first or second pixel electrode 200A or 200B and the other may be located on the overhang portion 123P.

The counter electrode 230 may be located on the intermediate layer 220. The counter electrode 230 may be continuously formed without being separated around the overhang portion 123P. In other words, the counter electrode 230 may be shared by light-emitting diodes, for example, the first and second light-emitting diodes LED1 and LED2. The counter electrode 230 may overlap pixel electrodes, for example, the first and second pixel electrodes 200A and 200B.

The counter electrode 230 may be formed of a conductive material having a low work function. The counter electrode 230 may include a (semi-)transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or an alloy thereof. By way of example, the counter electrode 230 may further include a layer formed of ITO, IZO, ZnO, or $In_2O_3$ on the (semi-)transparent layer including the above material.

The upper layer 240 may be continuously formed, like the counter electrode 230. The upper layer 240 may overlap light-emitting diodes, for example, the first and second light-emitting diodes LED1 and LED2. The upper layer 240 may include a LiF layer and/or a capping layer, and the capping layer may be an organic capping layer including an organic material, an inorganic capping layer including an inorganic material, or an organic-inorganic composite capping layer including an organic material and an inorganic material. The capping layer may include a carbocyclic compound, a heterocyclic compound, an amine group-containing compound, a porphine derivative, a phthalocyanine derivative, a naphthalocyanine derivative, an alkali metal complex, an alkaline earth metal complex, or any combination thereof. The carbocyclic compound, the heterocyclic compound, and the amine group-containing compound may optionally be substituted with a substituent including O, N, S, Se, Si, F, Cl, Br, I, or any combination thereof.

Although not shown in FIG. 13, the light-emitting diodes, for example, the first and second light-emitting diodes LED1 and LED2 may be protected by an encapsulation layer. The encapsulation layer may include at least one inorganic encapsulation layer including an inorganic insulating material and at least one organic encapsulation layer including an organic insulating material. In an embodiment, the encapsulation layer may include a first inorganic encapsulation layer, a second inorganic encapsulation layer, and an organic encapsulation layer between the first inorganic encapsulation layer and the second inorganic encapsulation layer.

Figure 14:
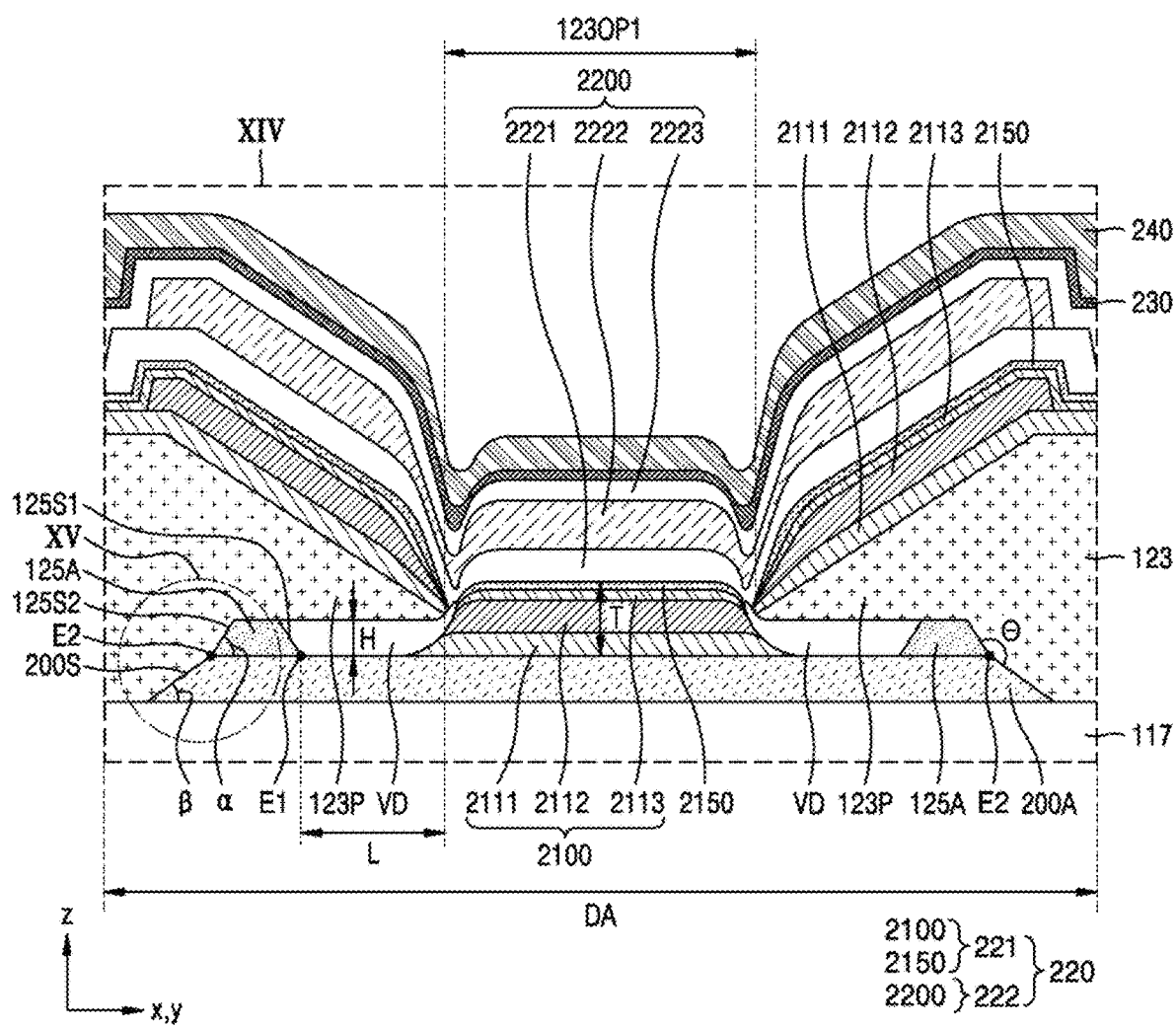
FIG. 14 is an enlarged schematic cross-sectional view illustrating a portion XIV of FIG. 13.

FIG. 14 is an enlarged schematic cross-sectional view illustrating a portion XIV of FIG. 13. Although FIG. 14 illustrates the first pixel electrode 200A and a structure on the first pixel electrode 200A, the description made with reference to FIG. 14 may apply to another pixel electrode and a structure on the pixel electrode, for example, the second pixel electrode 200B and a structure on the second pixel electrode 200B.

Referring to FIG. 14, the first pixel electrode 200A may be located on an insulating layer, for example, the fifth insulating layer 117, and the first protective layer 125A may be located on an outer portion of the first pixel electrode 200A.

The overhang portion 123P of the bank layer 123 may overlap an end, for example, an outer portion, of the first pixel electrode 200A. The first protective layer 125A may be disposed between the overhang portion 123P and the first pixel electrode 200A, the overhang portion 123P may extend past the first protective layer 125A in the horizontal direction (for example, the x or y direction), and the void VD (for example, gap or space) may be formed between the first pixel electrode 200A and the overhang portion 123P.

The horizontal length L of the overhang portion 123P may be greater than the vertical distance H of the overhang portion 123P. The horizontal length L of the overhang portion 123P refers to a length from a point (hereinafter, referred to as the first edge E1) where the first side surface 125S1, which is an inner surface of the first protective layer 125A, and a bottom surface of the first protective layer 125A meet each other to an edge of the overhang portion 123P in the horizontal direction (for example, the x or y direction). The vertical distance H of the overhang portion 123P refers to a length from a top surface of the first pixel electrode 200A to a bottom surface of the overhang portion 123P in the vertical direction (for example, the z direction).

In an embodiment, the horizontal length L of the overhang portion 123P may be in a range of about 100 nm to about 900 nm, and the vertical distance H from the top surface of the first pixel electrode 200A to the overhang portion 123P may be in a range of about 10 nm to about 900 nm. In an embodiment, the vertical distance H to the overhang portion 123P may be in a range of about 10 nm to about 90 nm. In an embodiment, the horizontal length L of the overhang portion 123P may be about 2 to 10 times the vertical distance H ($2H \leq L \leq 10H$). In an embodiment, the horizontal length L of the overhang portion 123P may be about 500 nm and the vertical distance H may be about 50 nm.

The first protective layer 125A may include the first side surface 125S1 facing the inside and the second side surface 125S2 opposite to the first side surface 125S1. The second side surface 125S2 of the first protective layer 125A may meet the side surface 200S of the first pixel electrode 200A. In other words, the second side surface 125S2 of the first protective layer 125A and the side surface 200S of the first pixel electrode 200A may be continuous. The second edge E2 where the second side surface and the bottom surface of the first protective layer 125A meet each other may be the same as an edge where the side surface 200S and the top surface of the first pixel electrode 200A meet each other. In other words, the second side surface 125S2 of the first protective layer 125A and the side surface 200S of the first pixel electrode 200A may meet each other at the second edge E2.

The second side surface 125S2 of the first protective layer 125A may be located on one side or a side of the second edge E2 and the side surface 200S of the first pixel electrode 200A may be located on the other side of the second edge E2. In a cross-sectional view shown in FIG. 14, the second side surface 125S2 of the first protective layer 125A and the side surface 200S of the first pixel electrode 200A may extend in different directions from the second edge E2. A minor angle θ between the second side surface 125S2 of the first protective layer 125A and the side surface 200S of the first pixel electrode 200A may be greater than 90° and less than 180° (90°<θ<180°).

The first inclination angle α of the second side surface 125S2 of the first protective layer 125A and the second inclination angle β of the side surface 200S of the first pixel electrode 200A may be different from each other. The first inclination angle α of the second side surface 125S2 of the first protective layer 125A with respect to the bottom surface of the first protective layer 125A may be greater than the second inclination angle β of the side surface 200S of the first pixel electrode 200A with respect to a bottom surface of the first pixel electrode 200A. In an embodiment, the first inclination angle α may be about 45° to about 60°, and the second inclination angle β may be less than the first inclination angle α.

The intermediate layer 220 may have a tandem structure including the charge generation layer 2150, the lower sub-layers 2100 under the charge generation layer 2150, and the upper sub-layers 2200 over the charge generation layer 2150.

The lower sub-layers 2100 may include the first lower common layer 2111, the lower functional layer 2112, and the second lower common layer 2113.

The first lower common layer 2111 may include, for example, a hole transport layer (HTL), or may include a hole transport layer and a hole injection layer (HIL). The second lower common layer 2113 may include an electron transport layer (ETL) and/or an electron injection layer (EIL).

The lower functional layer 2112 may include an emission layer or may have a multi-layer structure including an emission layer and an auxiliary layer. The emission layer may include a high molecular weight organic material or a low molecular weight organic material that emits light of a given color (for example, red light, green light, or blue light). The auxiliary layer may increase device efficiency by compensating for an optical resonance distance of light emitted from the emission layer. The auxiliary layer may include a resonance auxiliary material, for example, the same material as a hole transport layer. In an embodiment, a thickness of the lower functional layer 2112 may be greater than a thickness of the first lower common layer 2111 and/or a thickness of the second lower common layer 2113. A thickness of the first lower common layer 2111 may be greater than a thickness of the second lower common layer 2113.

The first lower common layer 2111 and the second lower common layer 2113 may be shared by other light-emitting diodes like the counter electrode 230 described with reference to FIG. 13, whereas the lower functional layer 2112 may be individually formed according to a corresponding light-emitting diode. In other words, the lower functional layer 2112 of each light-emitting diode may be separated and spaced apart from a lower functional layer of another adjacent light-emitting diode.

In an embodiment, the first lower common layer 2111 and/or the second lower common layer 2113 may be formed by using a mask having an opening that is substantially the same as the entire area of the display area DA. In this case, the second lower common layer 2113 may directly contact the first lower common layer 2111 around an end of the lower functional layer 2112. A contact area between the lower common layer 2113 and the first lower common layer 2111 may be located on a top surface of the bank layer 123. In an embodiment, at least one layer or a layer included in the second lower common layer 2113 may be formed by using a mask having openings respectively corresponding to light-emitting diodes, like the lower functional layer 2112.

The upper sub-layers 2200 may include the first upper common layer 2221, the upper functional layer 2222, and the second upper common layer 2223.

The first upper common layer 2221 may include a hole transport layer (HTL), or may include a hole transport layer and a hole injection layer (HIL). The second upper common layer 2223 may include an electron transport layer (ETL) and/or an electron injection layer (EIL).

The upper functional layer 2222 may include an emission layer or may have a multi-layer structure including an emission layer and an auxiliary layer. The emission layer may include a high molecular weight organic material or a low molecular weight organic material that emits light of a given color (for example, red light, green light, or blue light). The auxiliary layer may increase device efficiency by compensating for an optical resonance distance of light emitted from the emission layer. The auxiliary layer may include a resonance auxiliary material, for example, the same material as a hole transport layer. The emission layer of the upper functional layer 2222 may emit light of the same color as the emission layer of the lower functional layer 2112 and may include the same material as the emission layer of the lower functional layer 2112. In an embodiment, a thickness of the upper functional layer 2222 may be greater than a thickness of the first upper common layer 2221 and/or a thickness of the second upper common layer 2223. In an embodiment, a thickness of the upper functional layer 2222 may be less than a thickness of the first upper common layer 2221 and may be greater than a thickness of the second upper common layer 2223. A thickness of the second upper common layer 2223 may be less than a thickness of the first upper common layer 2221. In an embodiment, a thickness of the first upper common layer 2221 may be greater than a thickness of the first lower common layer 2111. A thickness of the second upper common layer 2223 may be greater than a thickness of the second lower common layer 2113.

The upper functional layer 2222 may be individually formed according to a corresponding light-emitting diode. In other words, the upper functional layer 2222 of each light-emitting diode may be separated and spaced apart from an upper functional layer of another adjacent light-emitting diode.

In an embodiment, the first upper common layer 2221 and the second upper common layer 2223 may be formed by using a mask having an opening that is substantially the same as the entire area of the display area DA. In this case, the second upper common layer 2223 may directly contact the first upper common layer 2221 around an end of the upper functional layer 2222. A contact area between the second upper common layer 2223 and the first upper common layer 2221 may be located on the top surface of the bank layer 123. In an embodiment, at least one layer or a layer included in the first upper common layer 2221 may be individually formed according to a light-emitting diode.

The charge generation layer 2150 may be located between the second lower common layer 2113 and the first upper common layer 2221. The charge generation layer 2150 may include a host and a dopant.

In an embodiment, the charge generation layer 2150 may have a double-layer structure including the N-type sub-charge generation layer nCGL and the P-type sub-charge generation layer pCGL. The N-type sub-charge generation layer and the P-type sub-charge generation layer may increase the luminous efficiency of a tandem type light-emitting diode including emission layers.

The N-type sub-charge generation layer may include an N-type dopant material and an N-type host material. The N-type dopant material may be an organic material or a mixture thereof, which may inject group 1 and 2 metals or electrons in the periodic table. For example, the N-type dopant material may be any one of an alkali metal and an alkaline-earth metal. For example, the N-type sub-charge generation layer may include, but is not limited to, an organic layer doped with an alkali metal such as lithium (Li), sodium (Na), potassium (K), or cesium (Cs), or an alkaline-earth metal such as magnesium (Mg), strontium (Sr), barium (Ba), or radium (Ra). The N-type host material may include a material that may transfer electrons. For example, the n-type host material may include at least one of, but not limited to, tris(8-hydroxyquinolino)aluminum (Alq3), 8-hydroxyquinolinolato-lithium (Liq), 2-(4-biphenylyl)-5-(4-tert-butylphenyl)-1,3,4oxadiazole (PBD), 3-(4-biphenyl)4-phenyl-5-tert-butylphenyl-1,2,4-triazole (TAZ), spiro-PBD, bis(2-methyl-8-quinolinolate)-4-(phenylphenolato)aluminum (BAlq), SAlq, 2,2',2-(1,3,5-benzinetriyl)-tris(1-phenyl-1-H-benzimidazole) (TPBi), oxadiazole, triazole, phenanthroline, benzoxazole, and benzthiazole.

The P-type sub-charge generation layer may include a P-type dopant material and a P-type host material. The P-type dopant material may include, but is not limited thereto, a metal oxide, an organic material such as a tetrafluoro-tetracyanoquinodimethane (F4-TCNQ), hexaazatriphenylene-hexacarbonitrile (HAT-CN), or hexaazatriphenylene, or a metal material such as $V_2O_5$, MoOx, or $WO_3$. The P-type host material may include a material that may transfer holes. For example, the p-type host material may include at least one of, but not limited to, N,N-dinaphthyl-N,N'-diphenyl benzidine (N,N'-bis(naphthalene-1-yl)-N,N'-bis(phenyl)-2,2'-dimethylbenzidine) (NPD), N,N'-bis-(3-methylphenyl)-N,N'-bis-(phenyl)-benzidine (TPD), and 4,4',4-Tris(N-3-methylphenyl-N-phenyl-amino)-triphenylamine (MTDATA).

Some sub-layers included in the intermediate layer 220, for example, the charge generation layer 2150 and the sub-layers 2100 under the lower sub-layers 2150, may include portions separated around the overhang portion 123P. The charge generation layer 2150 and the lower sub-layers 2100 may correspond to the sub-layers 221 located at relatively low positions from among the sub-layers of the intermediate layer 220 described with reference to FIG. 13.

A first portion of each of the first lower common layer 2111, the lower functional layer 2112, the second lower common layer 2113, and the charge generation layer 2150 may be located on the first pixel electrode 200A through the first opening 123OP1. A second portion of each of the first lower common layer 2111, the lower functional layer 2112, the second lower common layer 2113, and the charge generation layer 2150, which is separated from the first portion, may be located on the bank layer 123, for example, the overhang portion 123P.

In an embodiment, the sum T of thicknesses of the first lower common layer 2111, the lower functional layer 2112, the second lower common layer 2113, and the charge generation layer 2150 may be greater than the vertical distance H of the overhang portion 123P.

The remaining sub-layers included in the intermediate layer 220, for example, the first upper common layer 2221, the upper functional layer 2222, and the second upper common layer 2223, may be continuously formed without being separated around the overhang portion 123P. The upper sub-layers 2200 of FIG. 14 may correspond to the sub-layers 222 located at relatively high positions from among the intermediate layer 220 described with reference to FIG. 13.

Although the first upper common layer 2221, the upper functional layer 2222, and the second upper common layer 2223 are continuously formed in FIG. 14, the disclosure is not limited thereto. In an embodiment, at least one selected from among the first upper common layer 2221, the upper functional layer 2222, and the second upper common layer 2223 may be separated around the overhang portion 123P, like the charge generation layer 2150.

Each of the counter electrode 230 and the upper layer 240 may be continuously formed without being separated around the overhang portion 123P.

Figure 15:
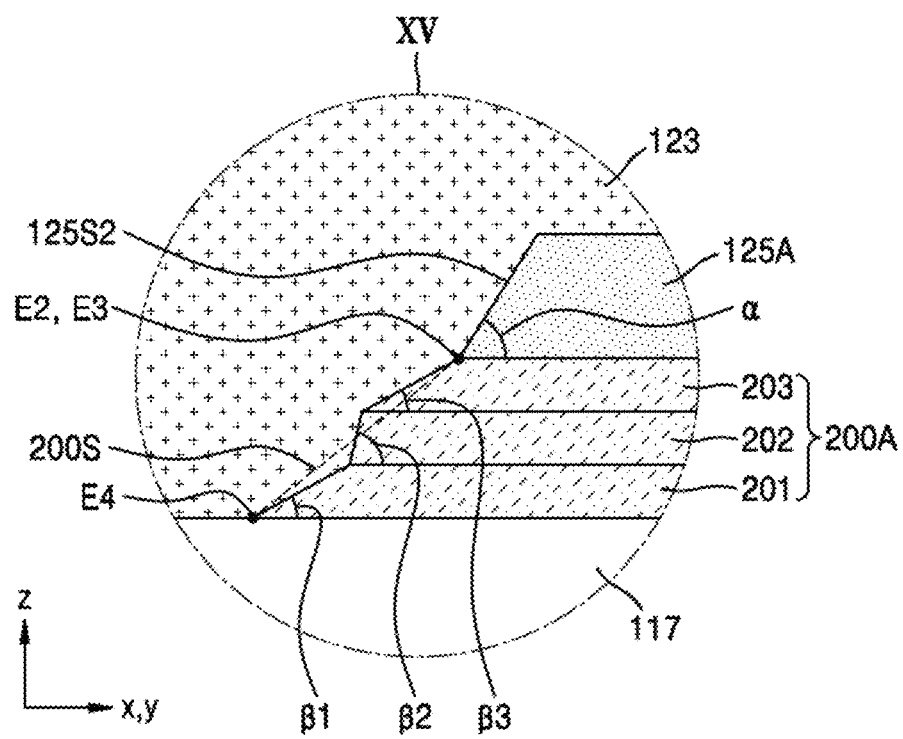
FIG. 15 is an enlarged schematic cross-sectional view illustrating a portion XV of FIG. 14.

FIG. 15 is an enlarged schematic cross-sectional view illustrating a portion XV of FIG. 14.

Referring to FIG. 15, the first pixel electrode 200A may have a multi-layer structure. For example, the first pixel electrode 200A may have a three-layer structure including the first layer 201, the second layer 202, and the third layer 203. A material of the second layer 202 may be different from a material of the first layer 201 and a material of the third layer 203.

In an embodiment, the second layer 202 may include silver (Ag), magnesium (Mg), aluminum (Al), platinum (Pt), palladium (Pd), gold (Au), nickel (Ni), neodymium (Nd), iridium (Ir), chromium (Cr), or a compound thereof. Each of the first layer 201 and the third layer 203 may include a conductive oxide. The conductive oxide may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the second layer 202 of the first pixel electrode 200A may be a layer including silver (Ag), and each of the first layer 201 and the third layer 203 may be a layer including ITO.

The inclination angle $\beta 2$ of a side surface of the second layer 202 may be different from at least one selected from among the inclination angle $\beta 1$ of a side surface of the first layer 201 and the inclination angle $\beta 3$ of a side surface of the third layer 203. For example, the inclination angle $\beta 2$ of the side surface of the second layer 202 with respect to a bottom surface of the second layer 202 may be greater than the inclination angle $\beta 1$ of the side surface of the first layer 201 with respect to a bottom surface of the first layer 201 and/or the inclination angle $\beta 3$ of the side surface of the third layer 203 with respect to a bottom surface of the third layer 203.

The side surface 200S of the first pixel electrode 200A described with reference to FIG. 14 may correspond to an inclined surface of a surface that connects an edge (for example, the fourth edge E4) where the bottom surface and the side surface of the first layer 201 of FIG. 15 meet each other to an edge (for example, the third edge E3) where a top surface and the side surface of the third layer 203 meet each other. The third edge E3 (see FIG. 14) where the top surface and the side surface of the third layer 203 of the first pixel electrode 200A of FIG. 15 meet each other may be substantially the same as the second edge E2 of the second side surface 125S2 of the first protective layer 125A described with reference to FIG. 14.

A structure of the first pixel electrode 200A described with reference to FIG. 15 may be applied to other pixel electrodes. For example, the second pixel electrode 200B may also have a three-layer structure as described with reference to FIG. 15.

FIGS. 16A to 16F are schematic cross-sectional views schematically illustrating a process of forming a display apparatus, according to an embodiment.

Figure 16A:
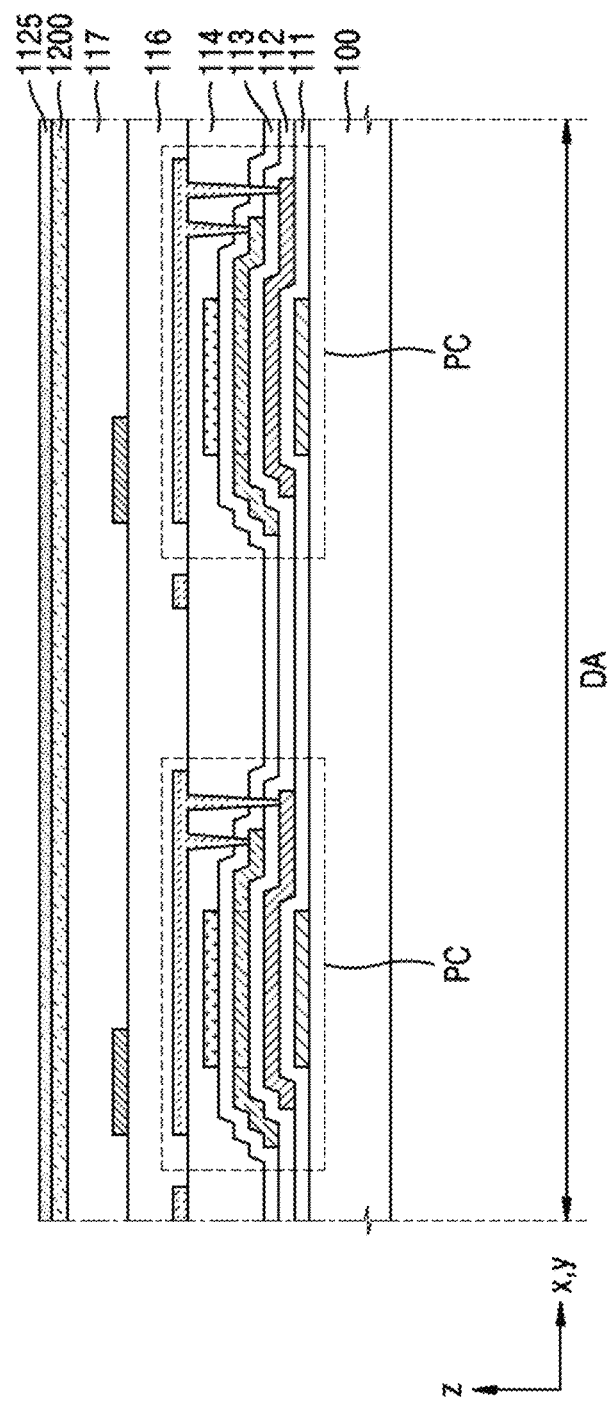
FIGS. 16A to 16F are schematic cross-sectional views schematically illustrating a process of forming a display apparatus, according to an embodiment.

Referring to FIG. 16A, the pixel circuits PC are formed on the substrate 100. The substrate 100, a structure of the pixel circuit PC, the buffer layer 111, and the first to fifth insulating layers 112, 113, 114, 116, and 117 may be the same as those described with reference to FIG. 13.

The electrode layer 1200 may be formed on the fifth insulating layer 117. Although not shown in FIG. 16A, the electrode layer 1200 may be electrically connected to a transistor of the pixel circuit PC.

The electrode layer 1200 may include layers. For example, the metal layer 1200 may include a metal film and a conductive oxide film located over and under the metal film. The metal film may include silver (Ag), magnesium (Mg), aluminum (Al), platinum (Pt), palladium (Pd), gold (Au), nickel (Ni), neodymium (Nd), iridium (Ir), chromium (Cr), or a compound thereof. The conductive oxide film may include indium tin oxide (ITO), indium zinc oxide (IZO), zinc oxide (ZnO), indium oxide ($In_2O_3$), indium gallium oxide (IGO), and/or aluminum zinc oxide (AZO). In an embodiment, the electrode layer 1200 may have a three-layer structure in which an indium tin oxide (ITO) layer, a silver (Ag) layer, and an indium tin oxide (ITO) layer are stacked each other.

The preliminary protective layer 1125 is formed on the electrode layer 1200. The preliminary protective layer 1125 may include a metal oxide. In an embodiment, the preliminary protective layer 1125 may include zinc oxide (ZnO). By way of example, the preliminary protective layer 1125 may include zinc oxide and at least one selected from among indium oxide (InO), gallium oxide (GaO), and tin oxide (SnO). The content (at %) of at least one selected from among indium oxide (InO), gallium oxide (GaO), and tin oxide (SnO) included in the preliminary protective layer 1125 may be less than the content (at %) of zinc oxide included in the preliminary protective layer 1125. In other words, the content (at %) of zinc oxide included in the preliminary protective layer 1125 may be greater than the content of other metal oxides.

Figure 16B:
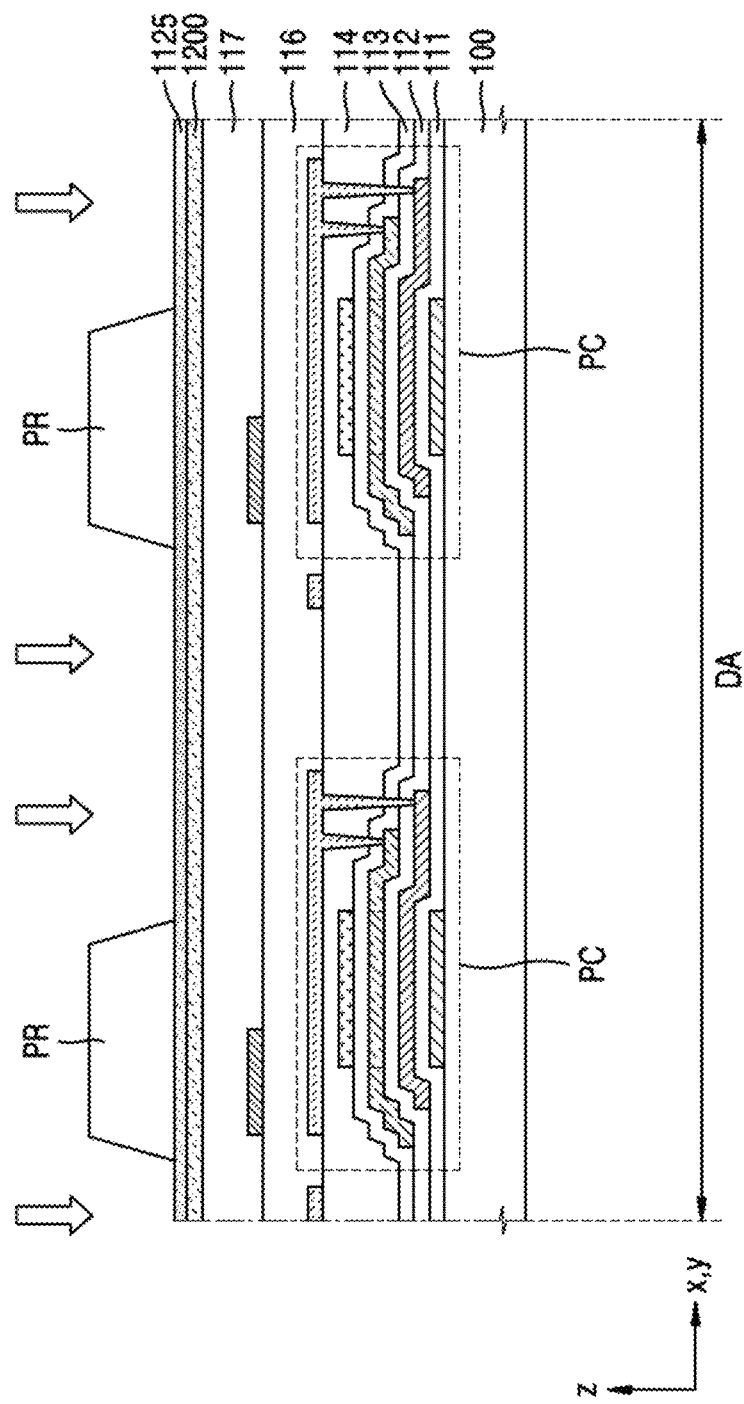
Figure 16C:
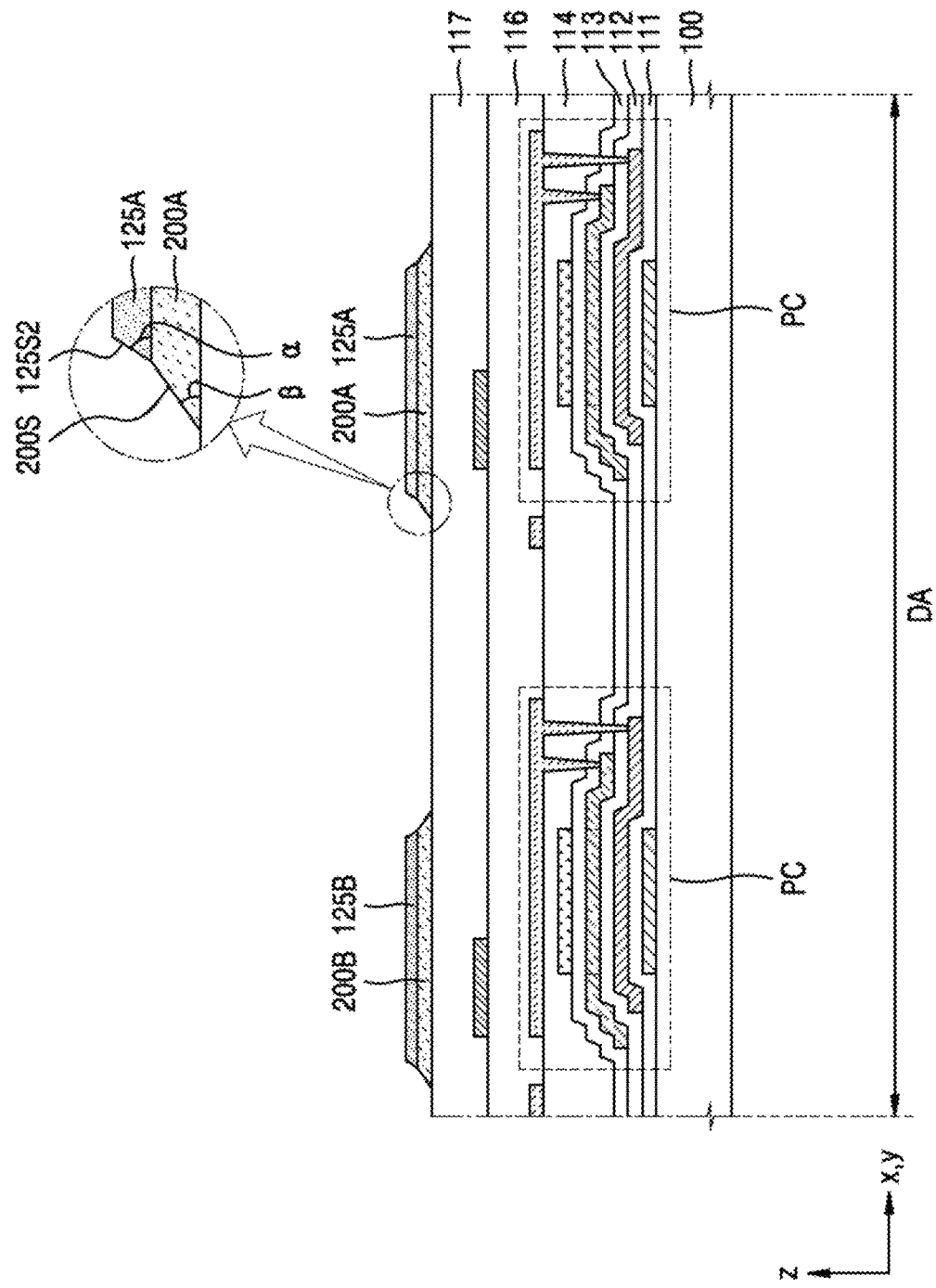

Referring to FIG. 16B, the photoresists PR are formed on a stacked structure of the electrode layer 1200 and the preliminary protective layer 1125. The photoresists PR may be spaced apart from each other. A part of the preliminary protective layer 1125 and a part of the electrode layer 1200 not overlapping the photoresist PR may be removed. A part of the preliminary protective layer 1125 and a part of the electrode layer 1200 may be removed through etching (for example, wet etching).

As a part of the electrode layer 1200 and a part of the preliminary protective layer 1125 are removed, pixel electrodes and protective layers on the pixel electrodes may be formed on the fifth insulating layer 117. In this regard, in FIG. 16C, the first pixel electrode 200A and the first protective layer 125A on the first pixel electrode 200A, and the second pixel electrode 200B, and the second protective layer 125B on the second pixel electrode 200B are formed. A first stacked structure of the first pixel electrode 200A and the first protective layer 125A and a second stacked structure of the second pixel electrode 200B and the second protective layer 125B may be spaced apart from each other.

The first pixel electrode 200A and the first protective layer 125A may be formed in the same etching process and thus, side surfaces of the first pixel electrode 200A and the first protective layer 125A may be connected to each other. As shown in an enlarged view of FIG. 16C, the side surface 200S of the first pixel electrode 200A and the second side surface 125S2 of the first protective layer 125A may be connected (for example, directly connected) to each other. The first inclination angle α of the second side surface 125S2 of the first protective layer 125A and the second inclination angle β of the side surface 200S of the first pixel electrode 200A may be different from each other. The first inclination angle α of the second side surface 125S2 of the first protective layer 125A with respect to a bottom surface of the first protective layer 125A may be greater than the second inclination angle β of the side surface 200S of the first pixel electrode 200A with respect to a bottom surface of the first pixel electrode 200A. In an embodiment, the first inclination angle α may be about 45° to about 60°, and the second inclination angle β may be less than the first inclination angle α.

The first pixel electrode 200A may include layers, for example, the first to third layers 201, 202, and 203 (see FIG. 15), as described with reference to FIG. 15, and features of the first to third layers 201, 202, and 203 (see FIG. 4) may be the same as those described with reference to FIG. 15. The second stacked structure of the second pixel electrode 200B and the second protective layer 125B is the same as the first stacked structure of the first pixel electrode 200A and the first protective layer 125A, and thus, a repeated description may be omitted.

Figure 16D:
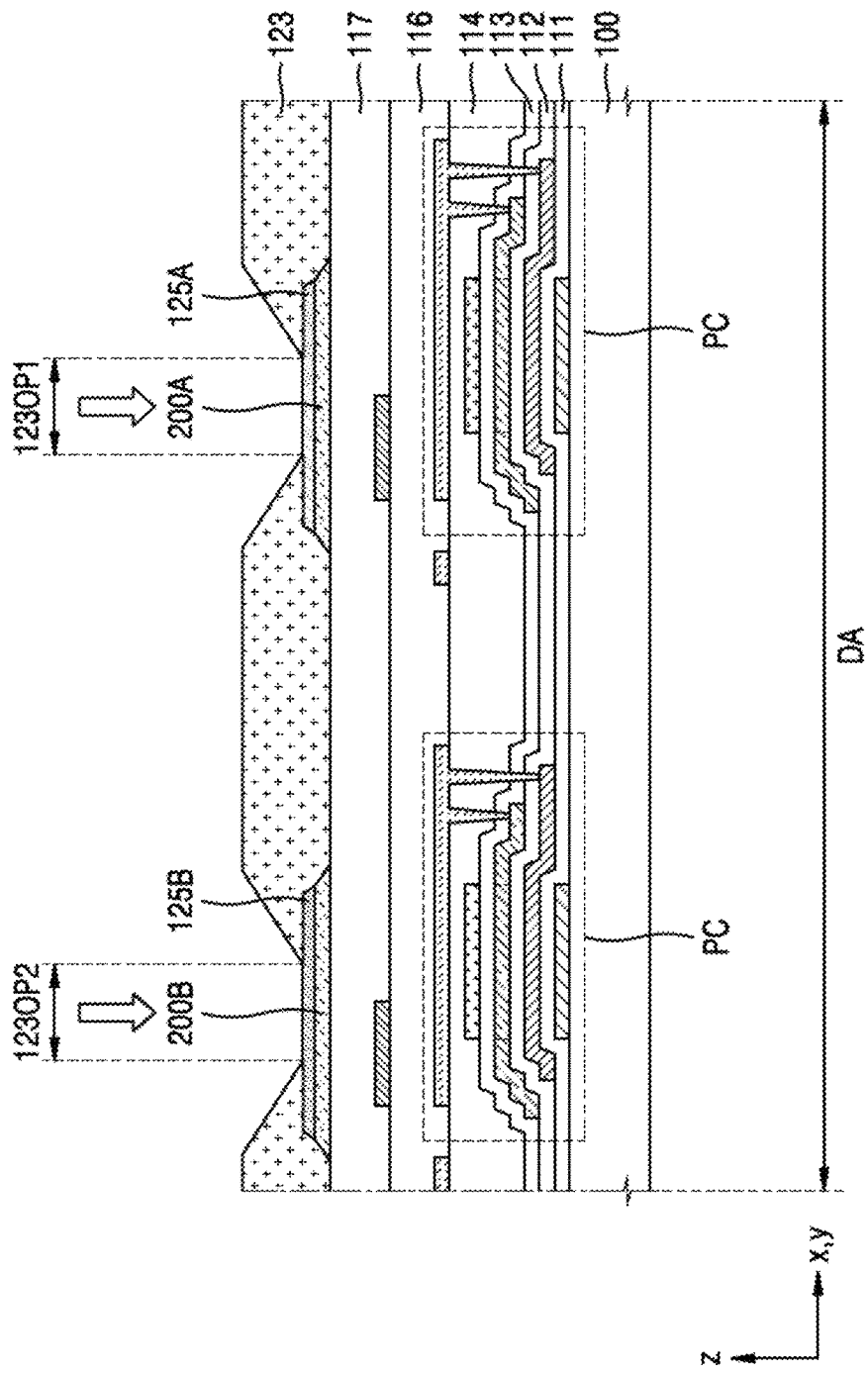

Referring to FIG. 16D, the bank layer 123 may be formed to cover a side surface of each of the first stacked structure and the second stacked structure. The bank layer 123 may have an opening overlapping a pixel electrode. In this regard, in FIG. 16D, the bank layer 123 may include the first opening 123OP1 overlapping the first pixel electrode 200A and the second opening 123OP2 overlapping the second pixel electrode 200B.

The bank layer 123 may include an organic insulating material, for example, an organic insulating material including a light-blocking material. In an embodiment, the bank layer 123 may include a polyimide (PI)-based binder, and a pigment in which red, green, and blue colors are mixed. By way of example, the bank layer 123 may include a cardo-based binder resin, and a mixture of a lactam black pigment and a blue pigment. By way of example, the bank layer 123 may include carbon black.

After the bank layer 123 is formed, a part of a protective layer may be removed through the opening of the bank layer 123. A part of the first protective layer 125A may be removed through the first opening 123OP1, and a part of the second protective layer 125B may be removed through the second opening 123OP2. As a part of the first protective layer 125A and a part of the second protective layer 125B are removed, each of the first protective layer 125A and the second protective layer 125B may have a closed loop shape (or a frame shape) in a plan view.

A part of the first protective layer 125A and a part of the second protective layer 125B may be removed through etching (for example, wet etching). The area of the removed part of the first protective layer 125A may be greater than the area of the first opening 123OP1, and the area of the removed part of the second protective layer 125B may be greater than the area of the second opening 123OP2. In other words, a portion of the first protective layer 125A overlapping the first opening 123OP1 and a surrounding portion thereof may be removed, and a portion of the second protective layer 125B overlapping the second opening 123OP2 and a surrounding portion thereof may be removed. Accordingly, the bank layer 123 may include the overhang portion 123P as shown in FIG. 16E.

Figure 16E:
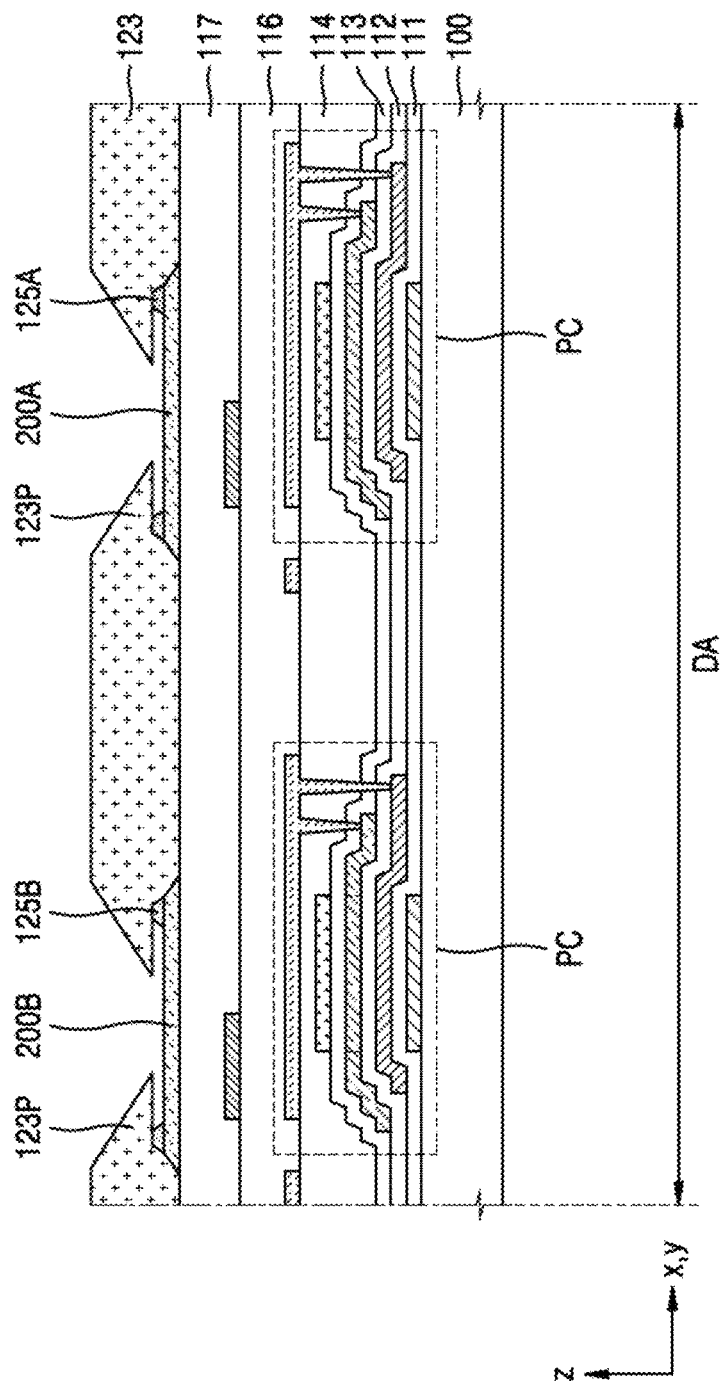

Referring to FIG. 16E, the overhang portion 123P may overlap an outer portion of each of the first pixel electrode 200A and the second pixel electrode 200B, and features of a horizontal length and a vertical distance of the overhang portion 123P are the same as those described with reference to FIG. 14.

Figure 16F:
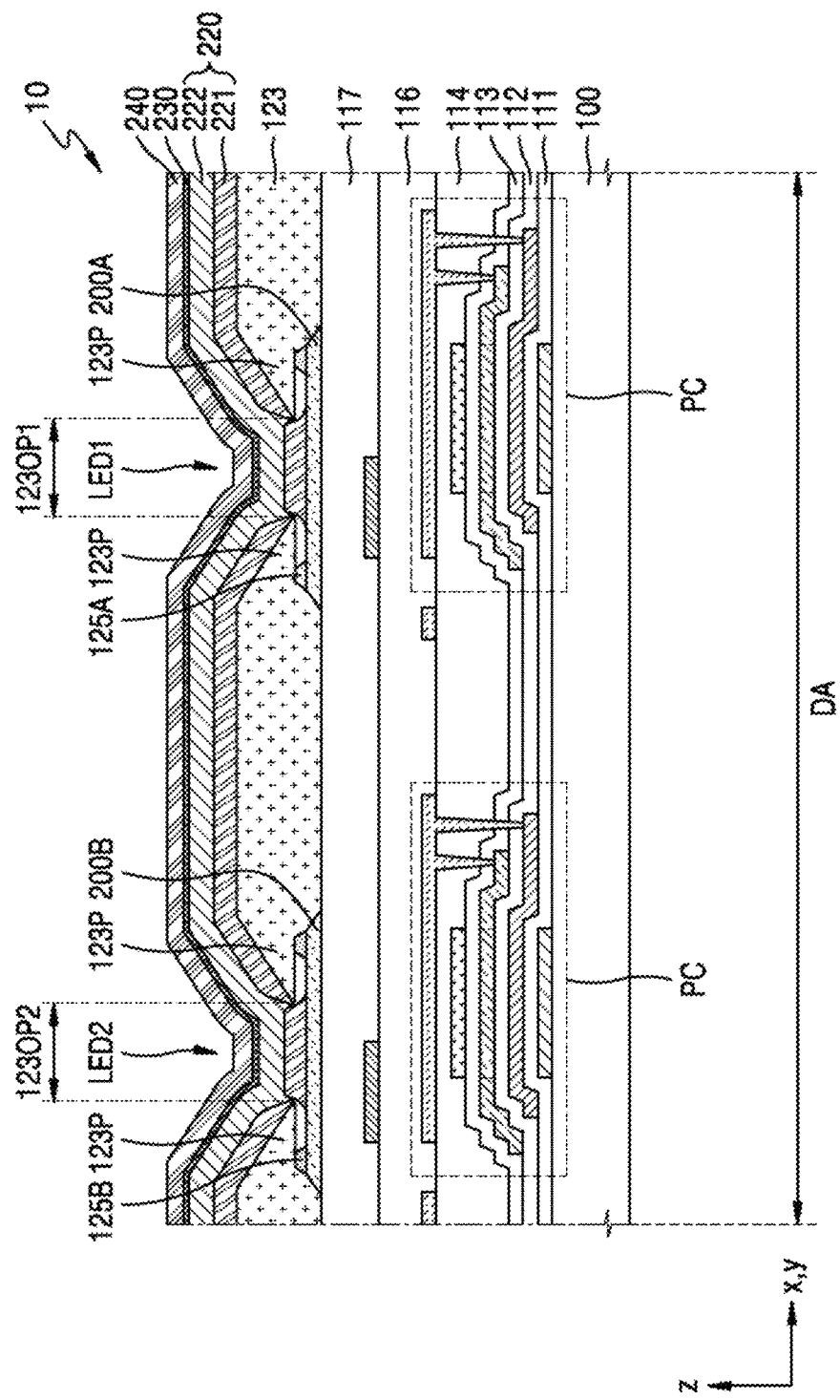

Referring to FIG. 16F, the intermediate layer 220, the counter electrode 230, and the upper layer 240 may be formed on the bank layer 123 including the overhang portion 123P. Each of the intermediate layer 220, the counter electrode 230, and the upper layer 240 may be formed through chemical vapor deposition.

The intermediate layer 220 may include sub-layers. Some or all of the sub-layers may be separated around the overhang portion 123P. In an embodiment, in FIG. 16F, some sub-layers 221 of the layers included in the intermediate layer 220 are separated around the overhang portion 123P, and the remaining sub-layers 222 of the layers included in the intermediate layer 220 are continuously formed. A structure of the intermediate layer 220 may be the same as that described with reference to FIG. 14, and thus, a repeated description may be omitted.

The counter electrode 230 and the upper electrode 240 may be continuously formed without being separated around the overhang portion 123P.

According to an embodiment described with reference to FIGS. 16A to 16E, because a pixel electrode and a protective layer are formed together by using the photoresist PR and the protective layer is etched by using the bank layer 123 as a mask, a material, for example, silver (Ag), included in the pixel electrode may be prevented from being released during an etching process and contaminating the display apparatus 10. Also, because less photoresist is used in a process of forming a light-emitting diode, the process may be simplified and time may be reduced. Also, because a charge generation layer included in the intermediate layer 220 formed through the above process is separated around the overhang portion 123P, leakage of current through the charge generation layer may be prevented. Because the counter electrode 230 is continuously formed without being separated unlike the charge generation layer, a voltage drop due to the resistance of the counter electrode 230 itself may be prevented.

According to an embodiment, because a bank layer including an overhang portion may be formed without a material included in a pixel electrode being released, and a charge generation layer may have portions separated through the overhang portion, the display quality of a display apparatus may be improved.

According to an embodiment, because a bank layer including an overhang portion may be formed without a material included in a pixel electrode being released through a simple process, and a charge generation layer may have portions separated through the overhang portion, the display quality of a display apparatus may be improved.

These effects are examples, and do not limit the scope of the disclosure.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by one of ordinary skill in the art that various changes in form and details may be made therein without departing from the spirit and scope and as defined by the following claims.

What is claimed is:

1. A display apparatus comprising:
   a first pixel electrode;
   a bank layer comprising a first opening overlapping the first pixel electrode, the bank layer comprising an overhang portion disposed over a top surface of the first pixel electrode;
   a first protective layer disposed between an outer portion of the first pixel electrode and the overhang portion of the bank layer;
   an intermediate layer overlapping the first pixel electrode through the first opening of the bank layer, the intermediate layer comprising a plurality of sub-layers; and
   a counter electrode disposed on the intermediate layer, wherein
   the overhang portion has a horizontal length from a first edge of a first side surface of the first protective layer to an edge of the overhang portion and has a vertical distance from the top surface of the first pixel electrode to the overhang portion,
   the plurality of sub-layers of the intermediate layer comprises:
      a charge generation layer;
      lower sub-layers below the charge generation layer; and
      upper sub-layers over the charge generation layer, and
   each of the lower sub-layers and the charge generation layer comprises a plurality of portions separated by the overhang portion, and
   a sum of a thickness of the charge generation layer and thicknesses of the lower sub-layers is greater than the vertical distance from the top surface of the first pixel electrode to the overhang portion.

2. The display apparatus of claim 1, wherein the charge generation layer comprises:
   an N-type sub-charge generation layer comprising an N-type dopant material and an N-type host material; and
   a P-type sub-charge generation layer comprising a P-type dopant material and a P-type host material.

3. The display apparatus of claim 1, wherein
   a top surface of the charge generation layer extends above a top surface of the protective layer, and
   a top surface of at least one of the lower sub-layers extends above the top surface of the protective layer.

4. The display apparatus of claim 1, wherein at least one of the upper sub-layers continuously extends without being separated around the overhang portion.

5. The display apparatus of claim 1, wherein the counter electrode continuously extends without being separated around the overhang portion.

6. The display apparatus of claim 1, wherein the horizontal length of the overhang portion is greater than the vertical distance.

7. The display apparatus of claim 1, wherein each of the lower sub-layers and the upper sub-layers comprises:
   a functional layer comprising an emission layer;
   a lower common layer below the functional layer; and
   an upper common layer over the functional layer.

8. The display apparatus of claim 7, further comprising:
   a second pixel electrode adjacent to the first pixel electrode, wherein
   the intermediate layer further comprises another functional layer overlapping the second pixel electrode and comprising an emission layer, and
   the functional layer and the another functional layer are spaced apart from each other.

9. The display apparatus of claim 1, wherein
   the first protective layer comprises a second side surface opposite to the first side surface, and
   a second edge where the second side surface of the first protective layer meets the top surface of the first pixel electrode is spaced apart from a third edge where a side surface of the first pixel electrode meets the top surface of the first pixel electrode.

10. The display apparatus of claim 1, wherein the first protective layer extends past a side surface of the first pixel electrode to a top surface of an insulating layer disposed below the first pixel electrode.

11. The display apparatus of claim 10, wherein the first protective layer directly contacts the side surface of the first pixel electrode.

12. A display apparatus comprising:
    a first pixel electrode;
    a bank layer comprising a first opening overlapping the first pixel electrode, the bank layer comprising an overhang portion disposed over a top surface of the first pixel electrode;
    a first protective layer disposed between an outer portion of the first pixel electrode and the overhang portion of the bank layer;
    an intermediate layer overlapping the first pixel electrode through the first opening of the bank layer, the intermediate layer comprising a plurality of sub-layers; and
    a counter electrode disposed on the intermediate layer, wherein
    the overhang portion has a horizontal length from a first edge of a first side surface of the first protective layer to an edge of the overhang portion and has a vertical distance from the top surface of the first pixel electrode to the overhang portion,
    the plurality of sub-layers of the intermediate layer comprises:
       a charge generation layer;
       lower sub-layers below the charge generation layer; and
       upper sub-layers over the charge generation layer,
    each of the lower sub-layers and the charge generation layer comprises a plurality of portions separated by the overhang portion,
    the first pixel electrode comprises:
       a first layer;
       a second layer disposed on the first layer; and
       a third layer disposed on the second layer, and
    an inclination angle of a side surface of the second layer is greater than at least one selected from among an inclination angle of a side surface of the first layer and an inclination angle of a side surface of the third layer.

13. The display apparatus of claim 1, wherein the first protective layer comprises a metal oxide.

14. A display apparatus comprising:

a first pixel electrode;

a bank layer comprising a first opening overlapping the first pixel electrode, the bank layer comprising an overhang portion disposed over a top surface of the first pixel electrode;

a first protective layer disposed between an outer portion of the first pixel electrode and the overhang portion of the bank layer;

an intermediate layer overlapping the first pixel electrode through the first opening of the bank layer; and a counter electrode disposed on the intermediate layer, wherein the intermediate layer comprises a plurality of sub-layers, at least one of the plurality of sub-layers comprises a plurality of portions separated around the overhang portion, the overhang portion has a horizontal length from a first edge of a first side surface of the first protective layer to an edge of the overhang portion and has a vertical distance from the top surface of the first pixel electrode to the overhang portion, the first protective layer comprises a second side surface opposite to the first side surface, wherein the first side surface is closer to a center of the first opening than the second side surface, a first inclination angle of the second side surface of the first protective layer is different from a second inclination angle of a side surface of the first pixel electrode, and at least one of the first inclination angle or the second inclination angle is less than 60°.

15. The display apparatus of claim 14, wherein the first inclination angle is greater than the second inclination angle.

16. The display apparatus of claim 14, wherein the horizontal length of the overhang portion is greater than the vertical distance.

17. The display apparatus of claim 14, wherein the second side surface of the first protective layer meets the side surface of the first pixel electrode at a second edge opposite to the first edge, and a minor angle between the second side surface of the first protective layer and the side surface of the first pixel electrode is greater than about 90° and less than about 180°.

18. The display apparatus of claim 14, wherein the first pixel electrode comprises:

a first layer;

a second layer disposed on the first layer; and a third layer disposed on the second layer, and an inclination angle of a side surface of the second layer is different from at least one selected from among an inclination angle of a side surface of the first layer and an inclination angle of a side surface of the third layer.

19. The display apparatus of claim 18, wherein the inclination angle of the side surface of the second layer is greater than at least one selected from among the inclination angle of the side surface of the first layer and the inclination angle of a side surface of the third layer.

20. The display apparatus of claim 14, wherein the plurality of sub-layers of the intermediate layer comprise:

a charge generation layer;

lower sub-layers below the charge generation layer; and upper sub-layers over the charge generation layer, and each of the lower sub-layers and the charge generation layer comprises a plurality of portions separated by the overhang portion.

21. The display apparatus of claim 20, wherein the charge generation layer comprises:

an N-type sub-charge generation layer comprising an N-type dopant material and an N-type host material; and a P-type sub-charge generation layer comprising a P-type dopant material and a P-type host material.

22. The display apparatus of claim 20, wherein a sum of a thickness of the charge generation layer and thicknesses of the lower sub-layers is greater than the vertical distance from the top surface of the first pixel electrode to the overhang portion.

23. The display apparatus of claim 20, wherein at least one of the upper sub-layers continuously extends without being separated around the overhang portion.

24. The display apparatus of claim 20, wherein each of the lower sub-layers and the upper sub-layers comprises:

a functional layer comprising an emission layer;

a lower common layer below the functional layer; and an upper common layer over the functional layer.

25. The display apparatus of claim 24, wherein the upper common layer and the lower common layer directly contact each other on the bank layer.

26. The display apparatus of claim 14, wherein the first protective layer comprises a metal oxide.

* * * * *